US011086215B2

(12) United States Patent
Lin et al.

(10) Patent No.: US 11,086,215 B2
(45) Date of Patent: Aug. 10, 2021

(54) EXTREME ULTRAVIOLET MASK WITH REDUCED MASK SHADOWING EFFECT AND METHOD OF MANUFACTURING THE SAME

(71) Applicant: Taiwan Semiconductor Manufacturing Co., Ltd., Hsinchu (TW)

(72) Inventors: Yun-Yue Lin, Hsinchu (TW); Hsin-Chang Lee, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 189 days.

(21) Appl. No.: 16/019,754

(22) Filed: Jun. 27, 2018

(65) Prior Publication Data
US 2019/0146331 A1 May 16, 2019

Related U.S. Application Data

(60) Provisional application No. 62/586,276, filed on Nov. 15, 2017.

(51) Int. Cl.
*G03F 1/58* (2012.01)
*G03F 1/24* (2012.01)
(Continued)

(52) U.S. Cl.
CPC .............. *G03F 1/58* (2013.01); *G03F 1/24* (2013.01); *G03F 1/38* (2013.01); *G03F 7/70033* (2013.01)

(58) Field of Classification Search
CPC ..... G03F 1/58; G03F 1/24; G03F 1/38; G03F 1/80; G03F 1/42; G03F 7/0033
See application file for complete search history.

(56) References Cited

U.S. PATENT DOCUMENTS 5,478,403 A * 12/1995 Shinagawa ............. G03F 7/427
                                             134/1.1
7,078,134 B2 * 7/2006 Wurm .................... B82Y 10/00
                                             378/35
(Continued)

FOREIGN PATENT DOCUMENTS

JP          11-162845    * 6/1999
JP        2009-071126    * 4/2009
(Continued)

OTHER PUBLICATIONS

Lyons et al., "liftoff lithography of metals fopr extreme ultraviolet lithography mask absorber patterning". Proc SPIE vol. 8322 articles 83221X (8 pages)(2012).*

(Continued)

*Primary Examiner* — Martin J Angebranndt
(74) *Attorney, Agent, or Firm* — McClure, Qualey & Rodack, LLP

(57) ABSTRACT

A reticle and a method for manufacturing a reticle are provided. The method includes forming a reflective multilayer (ML) over a front-side surface of a mask substrate. The method further includes forming a capping layer over the reflective ML. The method further includes forming a sacrificial multilayer over the capping layer. The method further includes forming an opening in the sacrificial multilayer to expose the capping layer. The method further includes forming a first absorption layer over the sacrificial multilayer and covering the capping layer in the opening. The method further includes removing the first absorption layer outside the opening in the sacrificial multilayer to form a first absorption pattern on a portion of the capping layer.

20 Claims, 31 Drawing Sheets

(51) Int. Cl.
*G03F 1/38* (2012.01)
*G03F 7/20* (2006.01)

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,952,503 B2* | 4/2018 | Huang | G03F 1/72 |
| 10,809,613 B2* | 10/2020 | Lin | G03F 1/22 |
| 2003/0091910 A1* | 5/2003 | Schwarzl | B82Y 40/00 430/5 |
| 2003/0170572 A1* | 9/2003 | Yan | B82Y 40/00 430/314 |
| 2004/0009408 A1* | 1/2004 | Fisch | B82Y 10/00 430/5 |
| 2004/0124174 A1* | 7/2004 | Yan | C03C 17/36 430/5 |
| 2004/0126670 A1* | 7/2004 | Liang | B82Y 10/00 430/5 |
| 2009/0047784 A1* | 2/2009 | Fuller | H01L 21/31058 438/691 |
| 2009/0220869 A1* | 9/2009 | Takai | G03F 1/24 430/5 |
| 2011/0059391 A1* | 3/2011 | Shoki | B82Y 10/00 430/5 |
| 2011/0117479 A1* | 5/2011 | Suga | G03F 7/70066 430/5 |
| 2011/0151358 A1* | 6/2011 | Kamo | B82Y 40/00 430/5 |
| 2012/0141923 A1* | 6/2012 | Deweerd | G03F 1/48 430/5 |
| 2013/0260292 A1* | 10/2013 | Yamazaki | G03F 1/24 430/5 |
| 2013/0280643 A1* | 10/2013 | Hsu | H01L 21/0337 430/5 |
| 2013/0316272 A1* | 11/2013 | Hayashi | G03F 1/24 430/5 |
| 2014/0051015 A1* | 2/2014 | Gallagher | G03F 1/24 430/5 |
| 2014/0186752 A1* | 7/2014 | Kinoshita | G03F 1/24 430/5 |
| 2015/0037544 A1* | 2/2015 | Lee | G03F 1/24 428/195.1 |
| 2016/0011499 A1* | 1/2016 | Hassan | G06F 16/447 430/5 |
| 2017/0038673 A1* | 2/2017 | Ikebe | G03F 1/48 |
| 2017/0194195 A1* | 7/2017 | Cohen | H01L 21/0276 |
| 2018/0299765 A1* | 10/2018 | Singh | G03F 1/24 |
| 2019/0101817 A1* | 4/2019 | Lin | G03F 1/24 |
| 2019/0196322 A1* | 6/2019 | Lin | G03F 1/54 |
| 2020/0050098 A1* | 2/2020 | Lin | G03F 7/2004 |

FOREIGN PATENT DOCUMENTS

| | | | | |
|---|---|---|---|---|
| JP | 2013-197481 | * | 9/2013 | G03F 71/24 |
| JP | 2014-090132 | * | 5/2014 | G03F 1/24 |
| KR | 2001-004043 | * | 1/2001 | H01L 21/027 |

OTHER PUBLICATIONS

Machine translation of JP 2009-071126 (2009).*
Machine transaltion of JP 11-162845 (1999).*
Machine translation of JP 2013-197481 (2013).*

* cited by examiner

EXTREME ULTRAVIOLET MASK WITH REDUCED MASK SHADOWING EFFECT AND METHOD OF MANUFACTURING THE SAME

CROSS REFERENCE TO RELATED APPLICATIONS

This application claims the benefit of U.S. Provisional Application No. 62/586,276 filed on Nov. 15, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

In one example, lithography is a technique frequently used in IC manufacturing for transferring IC designs to a semiconductor substrate. A typical lithography process includes coating a resist (or photo resist) over the substrate, exposing the resist to a radiation such as extreme ultraviolet (EUV) ray, and developing and partially stripping the resist to leave a patterned resist over the substrate. The patterned resist is used for subsequent etching processes in forming ICs. Advancement in lithography is generally desirable to meet the demand of the continued semiconductor miniaturization.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
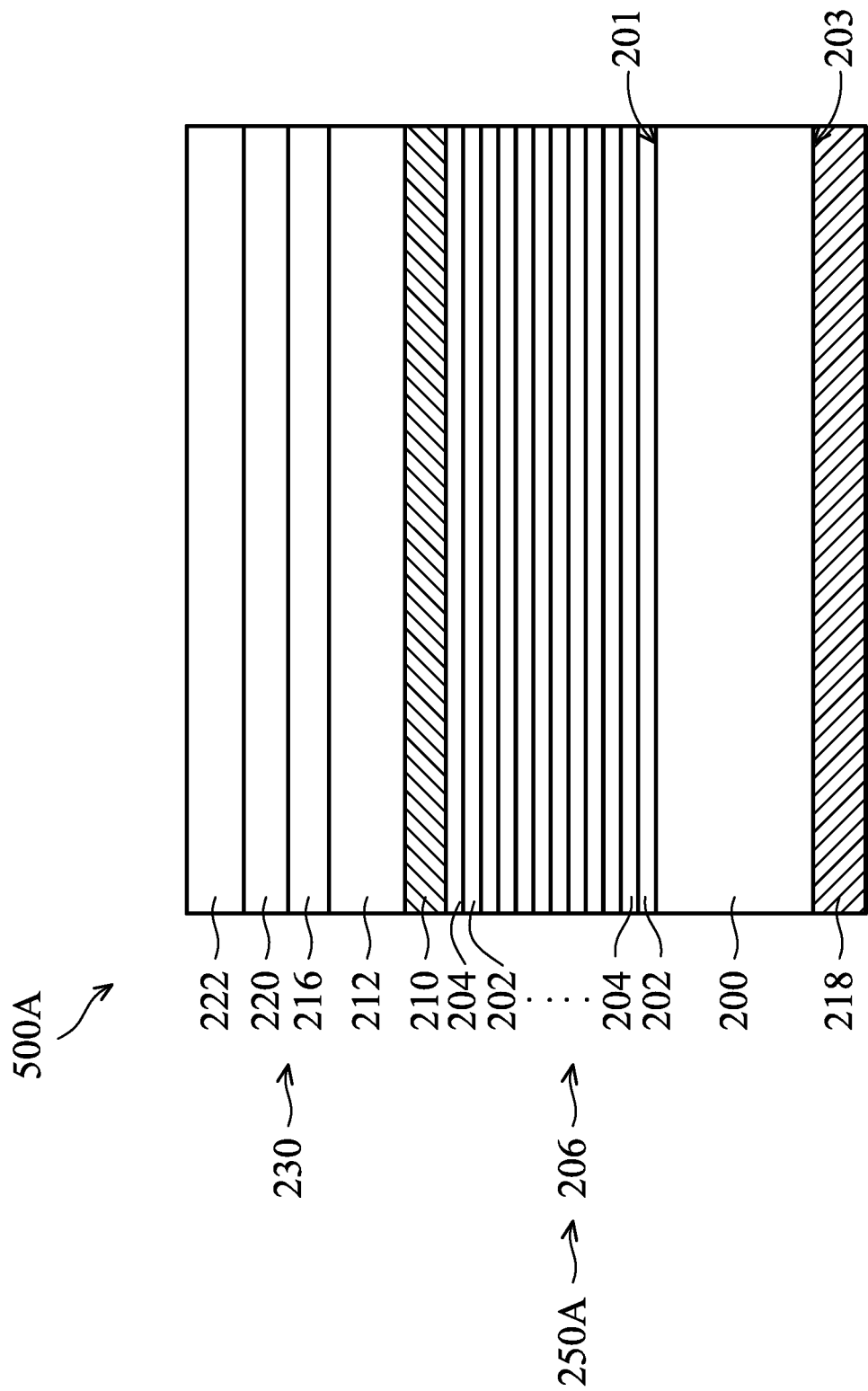
FIGS. 1A-1K are cross-sectional views of various stages of a process for manufacturing a reticle structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The advanced lithography process, method, and materials described in the current disclosure can be used in many applications, including fin-type field effect transistors (FinFETs). For example, the fins may be patterned to produce relatively close spacing between features, for which the above disclosure is well suited. In addition, spacers used in forming fins of FinFETs can be processed according to the above disclosure.

FIGS. 1A-1K are cross-sectional views of various stages of a process for manufacturing a reticle 500A, in accordance with some embodiments. In some embodiments, the reticle 500A is an extreme ultraviolet (EUV) reticle. The EUV lithography process utilizes a reflective reticle rather than a transmissive reticle. The EUV lithography process utilizes EUV scanners that emit light in the extreme ultraviolet (EUV) region, which is light having an extreme ultraviolet wavelength, such as 10-15 nm. In some embodiments, the EUV source generates EUV with wavelength at about 13.6 nm. Some EUV scanners may use reflective optics, i.e. mirrors and work in the vacuum environment. EUV scanners may provide the desired pattern on an absorption layer (e.g. an "EUV" reticle absorber) formed on a reflective reticle. Light within the EUV spectral range are highly absorbable by almost all materials. Thus, reflective optics rather than refractive optics are often used.

In some embodiments, the process for manufacturing a reticle 500A includes a blank reticle fabrication process and a reticle patterning process. During the blank reticle fabrication process, a blank reticle is formed by depositing suitable layers (e.g. a reflective multilayer, a capping layer and an absorption layer) on a suitable substrate. The blank reticle is patterned during the reticle patterning process to have a design of a layer of an integrated circuit (IC). The patterned reticle is then used to transfer circuit patterns (e.g. the design of a layer of an IC) onto a semiconductor wafer. The patterns on the reticle can be transferred repeatedly onto multiple wafers through various lithography processes. Several reticles (for example, a set of 15 to 30 reticles) may be used to construct a complete IC. In general, various reticles are fabricated for being used in various lithography processes. Types of EUV reticles may include binary intensity mask (BIM) and phase-shifting mask (PSM).

As shown in FIG. 1A, in the process for manufacturing the reticle 500A, a mask substrate 200 of a blank reticle 250A is received according to certain embodiments. The mask substrate 200 of the blank reticle 250A may have a front-side surface 201 and a back-side surface 203 opposite to the front-side surface 201. The mask substrate 200 may be made of a suitable material, such as a low thermal expansion material (LTEM) or fused quartz. In some embodiments, the LTEM includes $TiO_2$ doped $SiO_2$, or other suitable materials with low thermal expansion. The mask substrate 200 may serve to minimize image distortion due to mask heating. In addition, the mask substrate 200 may include materials with a low defect level and a smooth surface. For example, the number of the defects, which have sizes equal to or greater than 16 nm, in the mask substrate 200 is about 100 or less, and the defects may be pits and/or bumps. In some embodiments, the mask substrate 200 may have a surface roughness of about 0.2 nm or less in root-mean-square roughness (Rq).

As shown in FIG. 1A, a conductive layer 218 is formed over the back-side surface 203 of the mask substrate 200 opposite to the front-side surface 201 of the mask substrate 200. The conductive layer 218 may be positioned on the back-side surface 203 of the mask substrate 200 for the electrostatic chucking purpose. In some embodiments, the conductive layer 218 includes tantalum boron (TaB), chromium nitride (CrN), though other suitable compositions are possible.

As shown in FIG. 1A, the reflective multilayer (ML) 206 is formed over the front-side surface 201 of the mask substrate 200 by a deposition process. In accordance with the Fresnel equations, light reflection occurs when light propagates across an interface between two materials of different refractive indices. The greater the difference between the refractive indices of layers, the higher the intensity of the reflected light becomes as it propagates across the layers. To increase the intensity of the reflected light, in some embodiments, a multilayer of alternating materials may be used to increase the number of interfaces so as to cause the light reflected from each of the interfaces to interfere constructively. In some embodiments, the reflective ML 206 includes a plurality of film pairs, such as molybdenum-silicon (Mo/Si) film pairs (e.g. a layer of molybdenum above or below a layer of silicon in each film pair). In some other embodiments, the reflective ML 206 may include molybdenum-beryllium (Mo/Be) film pairs, or other suitable materials that are configurable to highly reflect the EUV light. The characteristics of the reflective ML 206 are selected such that it provides a high reflectivity to a selected electromagnetic radiation type/wavelength. For example, for the purpose of EUV lithography, the reflective ML 206 may be designed to reflect light within the EUV range. The thickness of each layer of the reflective ML 206 may depend on the EUV wavelength and the incident angle. Particularly, the thickness of the reflective ML 206 (and the thicknesses of the film pairs) may be adjusted to achieve a maximum constructive interference of the EUV light diffracted at each interface and a minimum absorption of the EUV light. In some embodiments, the number of the film pairs in the reflective ML 206 may be in a range from about 20 to about 80. However, any number of film pairs may be used. For example, the reflective ML 206 may include forty pairs of layers of Mo/Si. For example, each Mo/Si film pair has a thickness of about 7 nm and the reflective ML 206 has a total thickness of 280 nm. In such a case, a reflectivity of about 70% can be achieved.

Afterwards, a capping layer 210 is formed over the reflective ML 206. The capping layer 210 is configured to be transparent to EUV light and to protect the reflective ML 206 from damage and/or oxidation. In addition, the capping layer 210 may serve as an etching stop layer in a patterning or repairing/cleaning process of the absorption layer 212 over the capping layer 210. The capping layer 210 may have different etching characteristics from the absorption structure. In some embodiments, the capping layer 210 is formed of ruthenium (Ru), Ru compounds such as RuB, RuSi, RuN or RuON, chromium (Cr), Cr oxide, Cr nitride, boron (B), boron nitride, boron carbide, or any mixture(s) of the aforesaid. A low temperature deposition process is often chosen for the capping layer 210 to prevent inter-diffusion of the reflective ML 206. The thickness of the capping layer 210 may be in a range from about 0.5 nm to about 10 nm.

Afterwards, an absorption layer 212 is formed over the capping layer 210. In some embodiments, the absorption layer 212 is an absorption material to absorb the EUV light. In some embodiments, the extinction coefficient (k) of the absorption layer 212 is in a range from about 0.01 to about 0.04. In addition, the refractive index of the absorption layer 212 may be in a range from about 0.88 to about 1.02. For example, the absorption layer 212 may be formed of Ta-based materials. For example, the absorption layer 212 may include multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum oxide, ruthenium, molybdenum, other suitable materials, and/or mixture of some of the above.

In some embodiments, the reflective ML 206, the capping layer 210 and the absorption layer 212 may be formed by various deposition processes. For example, the deposition processes may include physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

After performing the aforementioned blank reticle fabrication processes, the blank reticle 250A is formed, as shown in FIG. 1A in accordance with some embodiments. In some embodiments, the blank reticle 250A is an extreme ultraviolet (EUV) blank reticle. The blank reticle 250A may include the mask substrate 200, the reflective multilayer (ML) 206, the capping layer 210 and the absorption layer 212.

Afterwards, a sacrificial multilayer 230 is formed over the capping layer 210 of the blank reticle 250A, as shown in FIG. 1A in accordance with some embodiments. In some embodiments, the sacrificial multilayer 230 includes the absorption layer 212 of the blank reticle 250A, an anti-reflection layer 216, a hard mask layer 220 and a resist layer 222. The absorption layer 212 may be formed over the capping layer 210. The anti-reflection layer 216 may be formed over the absorption layer 212. The hard mask layer 220 may be formed over the anti-reflection layer 216. In addition, the resist layer 222 may be formed over the hard mask layer 220.

In some embodiments, the anti-reflection layer 216 is configured to reduce reflection of a light having a shorter wavelength than the extreme ultraviolet (EUV) range from the absorption layer 212 by destructive interference. The anti-reflection layer 216 may include a polymeric material or a material selected from the group consisting of silicon oxide, silicon oxygen carbide, and plasma enhanced chemical vapor deposited silicon oxide. The anti-reflection layer 216 may be formed by a coating process including a spin-on coating process. In some embodiments, the hard mask layer 220 is formed of silicon oxide, silicon nitride, silicon oxynitride, silicon carbide, another suitable material, tantalum oxide (TaO), tantalum boron oxide (TaBO), or a combination thereof. The hard mask layer 220 may be formed by a deposition process including a chemical vapor deposition (CVD) process, a physical vapor deposition (PVD) process, an atomic layer deposition (ALD) process and/or other suitable process. For example, the hard mask layer 220 may be made of tantalum oxide (TaO) or tantalum boron oxide (TaBO) and formed by a PVD process. In some embodiments, the resist layer 222 is formed of materials including a photoresist, metal oxide, metal nitride or metal oxynitride. In some embodiments, the photoresist includes a positive photoresist and formed by a spin-on coating process followed by a soft baking process.

Figure 1B:
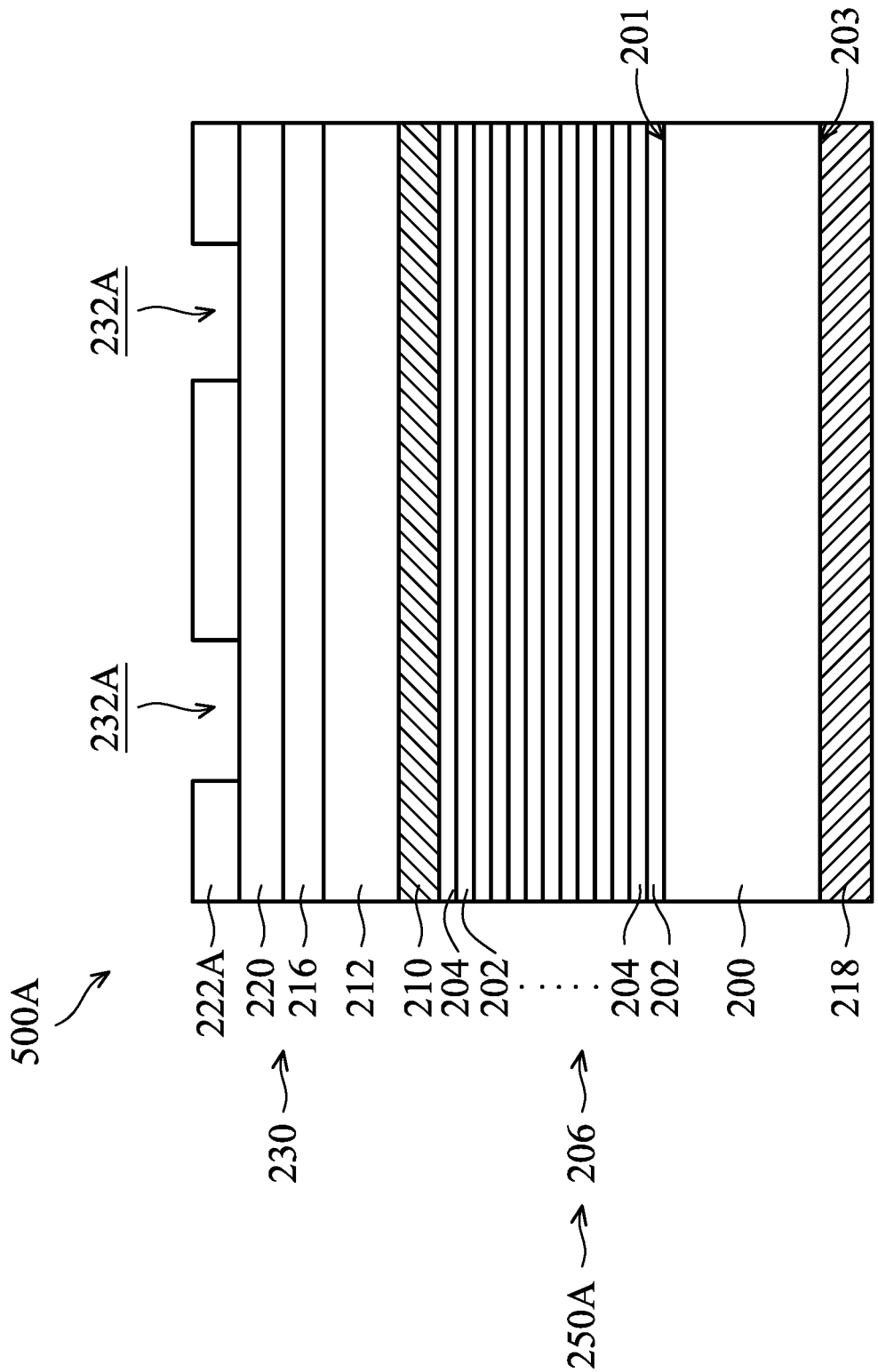

Afterwards, the resist layer 222 is patterned to form resist patterns 222A on the hard mask layer 220 by a patterning process, as shown in FIG. 1B in accordance with some embodiments. In some embodiments, the patterning process includes a photolithography process or an etching process. The photolithography process is configured to form openings 232A in the resist layer 222 (FIG. 1A). The openings 232A are formed passing through the resist layer 222 to expose the hard mask layer 220. In some embodiments, the photolithography process includes exposure, post-exposure baking, developing, rinsing, drying (e.g. hard baking), other suitable processes, and/or combinations thereof to form the resist patterns 222A. For example, electron, ion, or photon beam direct writing may be used for the exposure step in the mask patterning process. In some embodiments, the etching process includes a dry etching process performed using halogen-based gas mixing with $O_2$, Na, NO and/or $H_2O$ (e.g. a halogen-based gas mixed with Na may be used in the dry etching process, or a halogen-based gas mixed with $O_2$, Na and NO may be used to improve the etching profile and enhance the etching selectivity), and a carrier gas such as He or Ar or mixtures thereof. The halogen-based gas may include $Cl_2$, $CHF_3$, $CH_3F$, $C_4F_8$, $CF_4$, $SF_6$, $CF_3Cl$, or a mixture thereof.

Figure 1C:
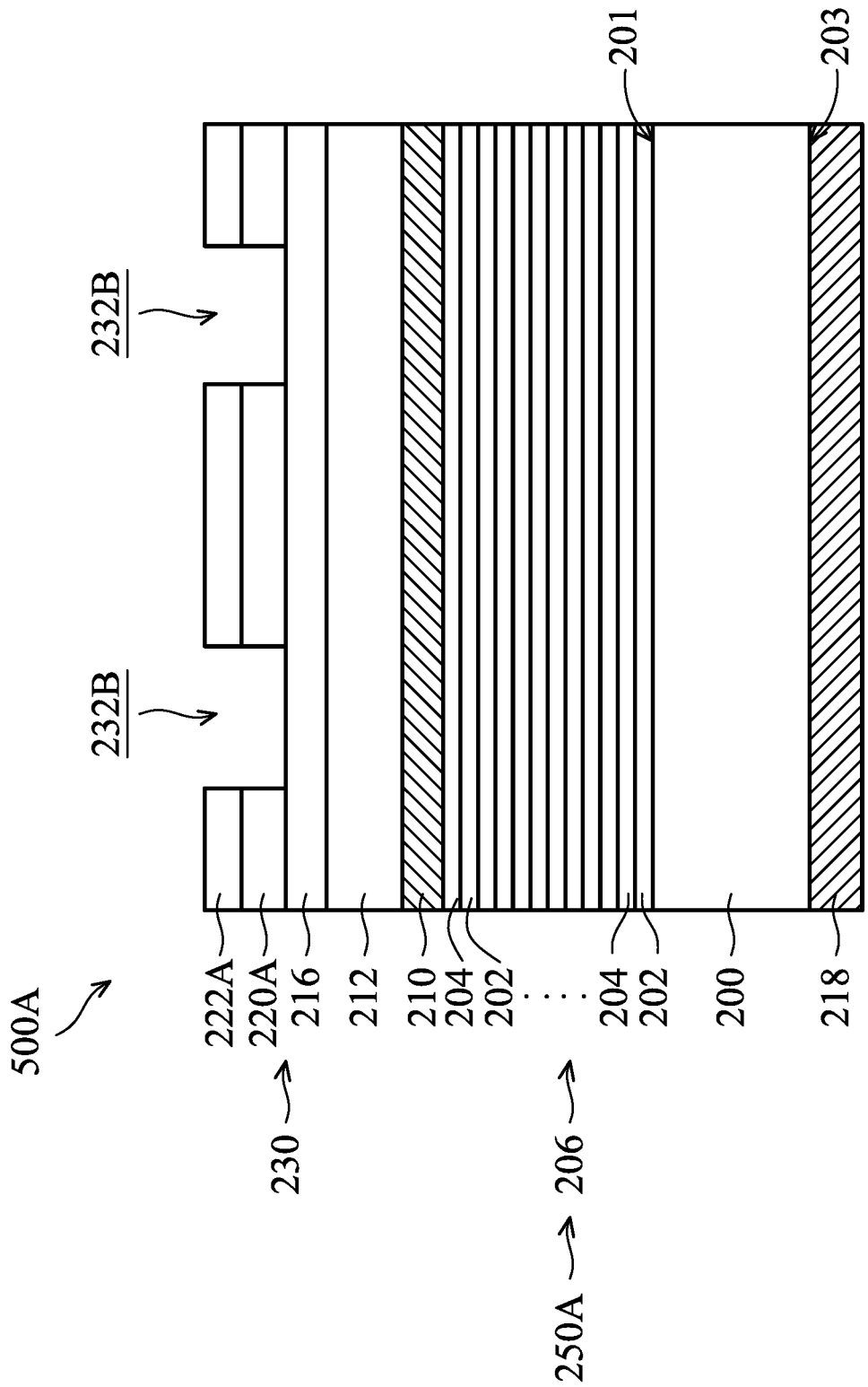

Afterwards, a portion of the hard mask layer 220 (FIG. 1B) that is not covered by the resist patterns 222A are removed by an etching process, as shown in FIG. 1C in accordance with some embodiments. The etching process may stop on the anti-reflection layer 216 to form openings 232B in the hard mask layer 220 (FIG. 1B). The openings 232B are formed passing through the hard mask layer 220 to expose the anti-reflection layer 216. In addition, the hard mask layer 220 is patterned to form hard mask patterns 220A shown in FIG. 1C. In some embodiments, the etching process includes a dry etching process performed using halogen-based gas mixing with $O_2$, Na, NO and/or $H_2O$ and a carrier gas such as He or Ar or mixtures thereof, to remove the uncovered portion of the hard mask layer 220. The halogen-based gas may include $Cl_2$, $CHF_3$, $CH_3F$, $C_4F_8$, $CF_4$, $SF_6$, $CF_3Cl$, or a mixture thereof.

After performing the etching processes of the hard mask layer 220, the thickness of the resist patterns 222A may be reduced.

Figure 1D:
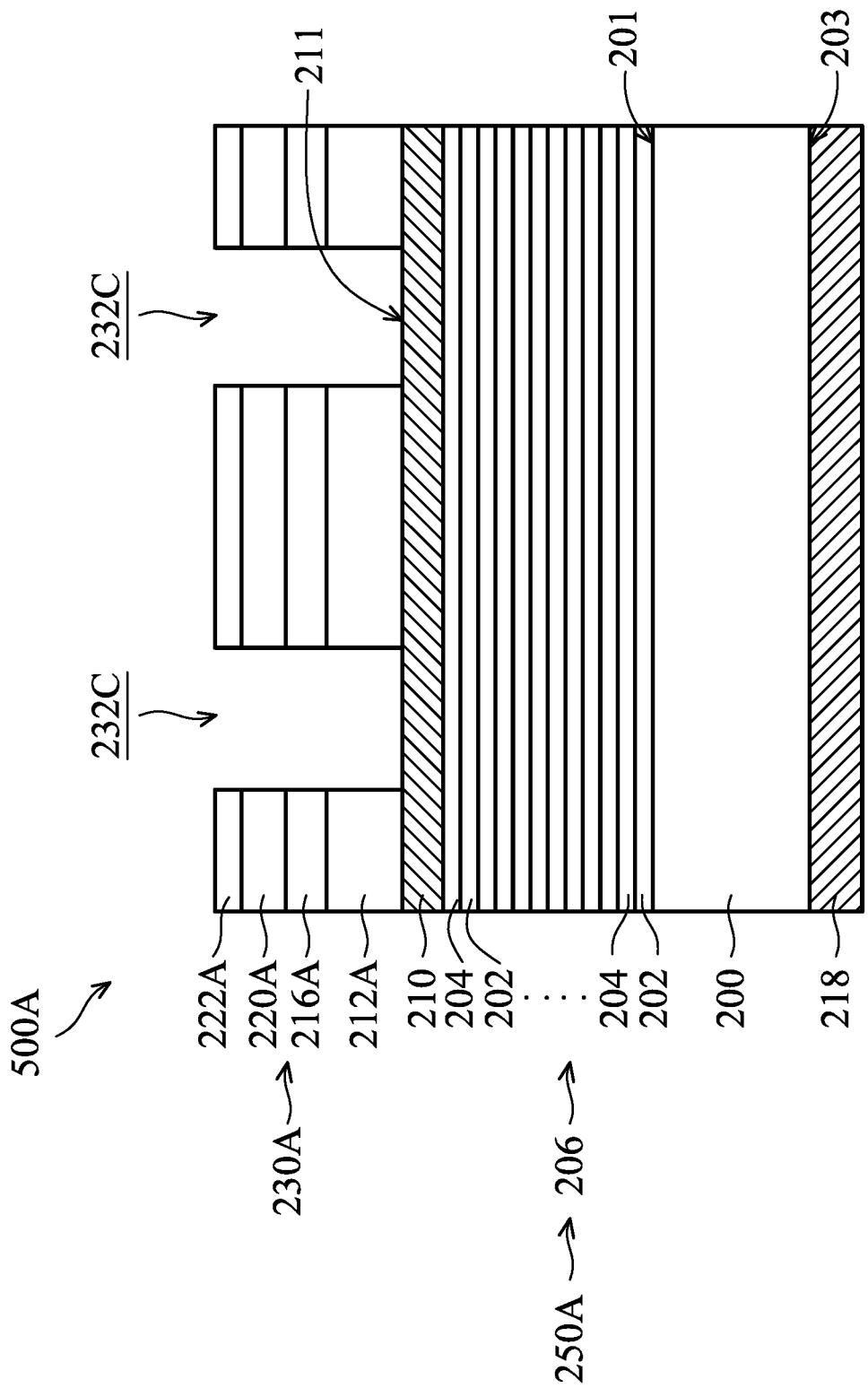

Afterwards, a portion of the anti-reflection layer 216 that is not covered by the resist patterns 222A and the underlying hard mask patterns 220A is removed to form anti-reflection patterns 216A by another etching process. The etching process of the anti-reflection layer 216 may stop on the absorption layer 212. Afterwards, a portion of the absorption layer 212 that is not covered by the resist patterns 222A, the hard mask patterns 220A and the anti-reflection patterns 216A is removed by yet another etching process, as shown in FIG. 1D in accordance with some embodiments. The etching process of the absorption layer 212 may stop on the capping layer 210. In addition, the etching processes of the anti-reflection layer 216 and the absorption layer 212 may form openings 232C in the anti-reflection layer 216 and the absorption layer 212 (FIG. 1C). The openings 232C are formed passing through the anti-reflection layer 216 and the absorption layer 212 to expose the capping layer 210. In addition, the anti-reflection layer 216 is patterned to form the anti-reflection patterns 216A. Furthermore, the absorption layer 212 is patterned to form absorption patterns 212A shown in FIG. 1D. In some embodiments, the etching processes of the anti-reflection layer 216 and the absorption layer 212 include a dry etching process. In some embodiments, the etching processes are performed using an etching gas including chlorine ($Cl_2$), fluorine ($F_2$), carbon (C), oxygen ($O_2$), nitrogen ($N_2$), $SF_6$, $CH_3Cl$, $CH_2Cl_2$ or a mixture thereof.

After performing the etching processes of the anti-reflection layer 216 and the absorption layer 212, the thickness of the resist patterns 222A may be reduced.

As shown in FIG. 1D, stacks of the resist patterns 222A, the hard mask patterns 220A, the anti-reflection patterns 216A and the absorption patterns 212A may be used to form sacrificial multilayer patterns 230A covering a portion of a top surface 211 of the capping layer 210. In some embodiments, the sacrificial multilayer patterns 230A can block a portion of the capping layer 210. The sacrificial multilayer patterns 230A may prevent the reticle patterns of the resulting reticle 500A from forming on the blocked portion of the capping layer 210 in the subsequent processes. In addition, a remaining portion of the capping layer 210 that is not covered by the sacrificial multilayer patterns 230A may be provided to allow the reticle patterns (e.g. absorption patterns 234B shown in FIG. 1G) to be formed thereon.

Figure 1E:
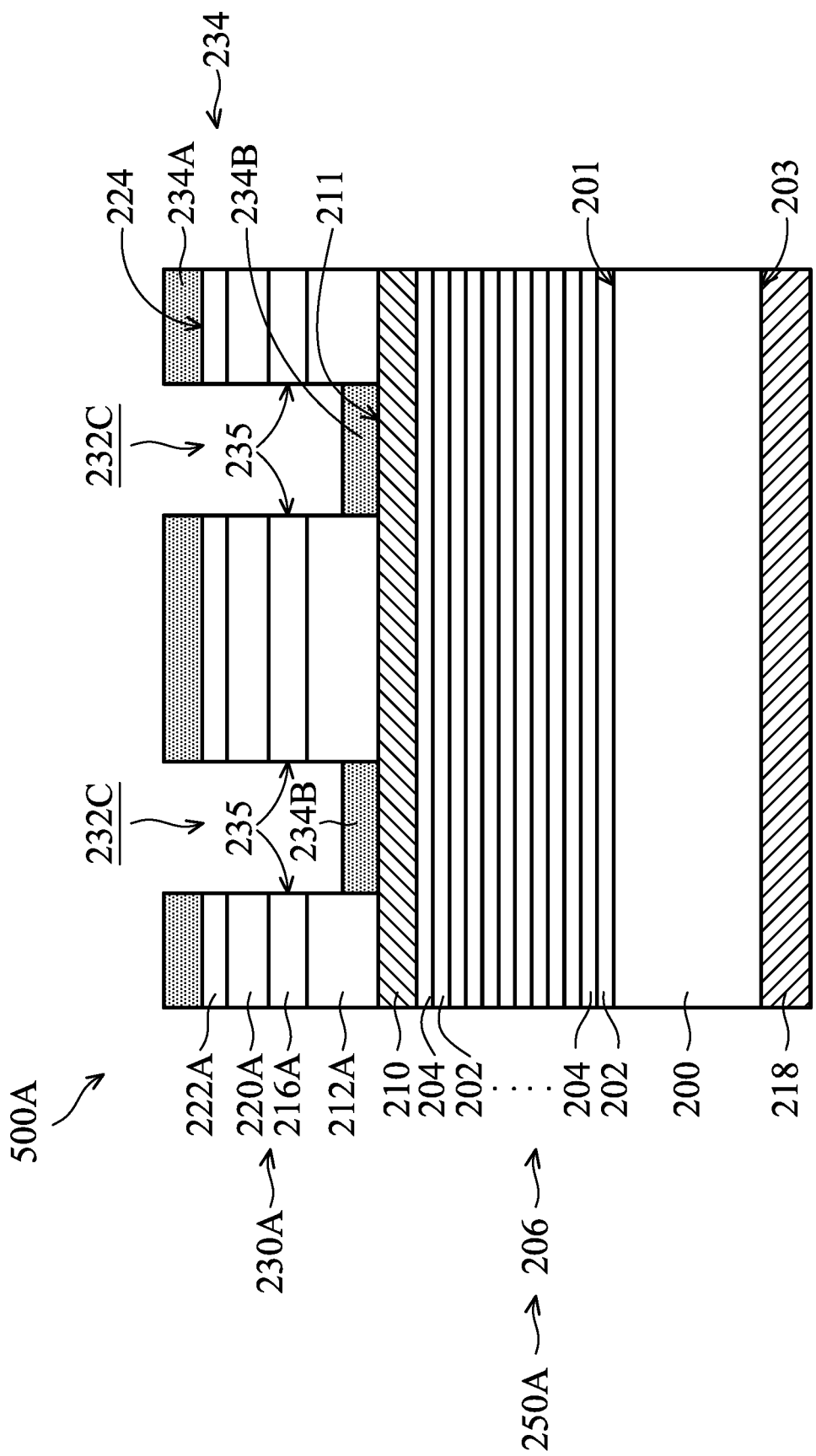

Afterwards, an absorption layer 234 is formed over the patterned sacrificial multilayer (e.g. the sacrificial multilayer patterns 230A) and covering the capping layer 210 in the openings 232C by a deposition process, as shown in FIG. 1E in accordance with some embodiments. The deposition process of the absorption layer 234 may be performed to form one or more first portions 234A and one or more second portions 234B simultaneously. The first portions 234A may be formed outside the openings 232C, and the second portion 234B may be formed in the openings 232C surrounded by the sacrificial multilayer patterns 230A. The first portions 234A may not be leveled with the second portion 234B of the absorption layer 234. For example, the first portions 234A of the absorption layer 234 may be formed in contact with top surfaces 224 of the sacrificial multilayer patterns 230A. In addition, the second portions 234B of the absorption layer 234 may be formed in contact with the top surface 211 of the capping layer and sidewall surfaces 235 of the sacrificial multilayer patterns 230A. Furthermore, the second portions 234B of the absorption layer 234 may be surrounded by the sacrificial multilayer patterns 230A.

In the EUV lithography system (e.g. the EUV scanner), the EUV light rays incident on the reticle at the same angle of incidence (AOI), for example, AOI=6 degree, as that of the chief ray. However, if the required thickness of the absorption layer is too great, there arises the mask shadowing effect, which in turn degrades aerial image contrast. Therefore, a compromise between the extinction coefficient (k), the refractive index, and the thickness of the absorption layer 234 is required.

In some embodiments, the extinction coefficient (k) of the absorption layer 234 is greater than the extinction coefficient (k) of the absorption layer formed of Ta-base materials (e.g. the absorption layer 212 of the sacrificial multilayer 230 or the absorption patterns 212A of the sacrificial multilayer patterns 230A). For example, the extinction coefficient (k) of the absorption layer 234 is in a range from about 0.04 to about 1. In addition, the refractive index of the absorption layer 234 may be in a range from about 0.88 to about 1.02. For example, the absorption layer 234 may include silver (Ag), platinum (Pt), gold (Au), tungsten (W), nickel (Ni), cobalt (Co), copper (Cu), chromium (Cr), vanadium (V), zinc (Zn), tellurium (Te), iridium (Ir), tin (Sn), an oxide thereof, a nitride thereof, an oxynitride thereof, or a combination thereof. The absorption layer 234 may be formed by a deposition process including a chemical vapor deposition (CVD) process, a physical vapor deposition (PVD) process and/or other suitable process.

Because the extinction coefficient (k) of the absorption layer 234 has a high extinction coefficient (k), the thickness of the absorption layer 234 may be reduced further than the Ta-based absorption layer (e.g. the absorption layer 212) to achieve the required absorption of the EUV light. For example, the thickness T2 the absorption layer 234 may be less than the thickness T1 of the absorption layer 212 (e.g. formed of Ta-based materials). For example, the thickness T2 the absorption layer 234 may be half less than the thickness T1 of the absorption layer 212. For example, the thickness T1 of the absorption layer 212 may be in a range from about 60 nm to about 80 nm (e.g. about 70 nm), and the thickness T2 the absorption layer 234 may be in a range from about 20 nm to about 40 nm (e.g. about 30 nm). The mask shadowing effect during the exposure process may be reduced or eliminated. In addition, the aerial image contrast may be improved. In addition, the depth of focus (DOF) of the absorption layer 234 may be reduced.

Figure 1F:
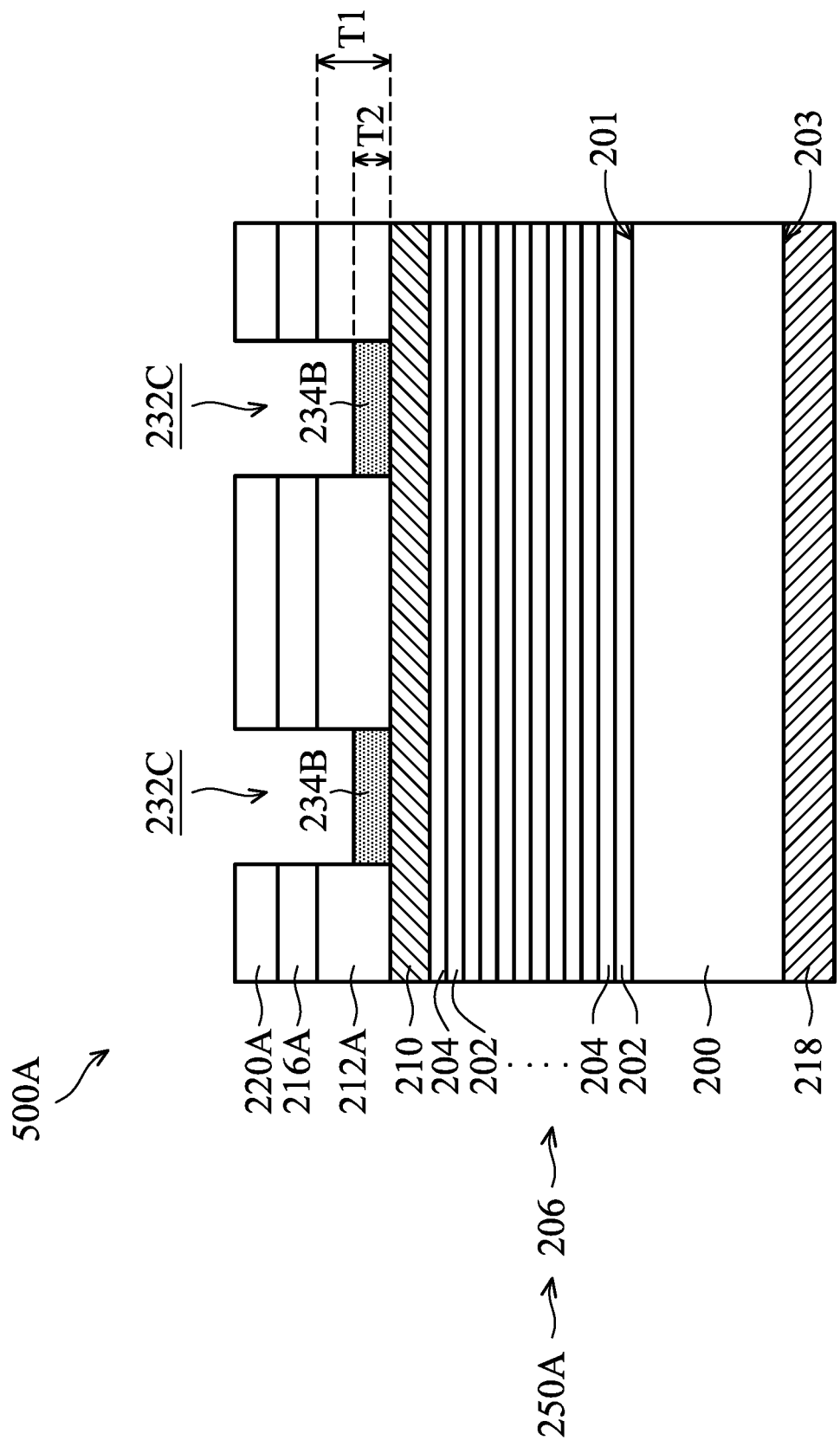

Afterwards, the absorption layer 234 outside the openings 232C (i.e. the first portions 234A of the absorption layer 234) is removed from the top surfaces 224 of the sacrificial multilayer patterns 230A by a first removal process, as shown in FIG. 1F in accordance with some embodiments. The first removal process may be configured to remove the resist patterns 222A underlying the first portions 234A of the absorption layer 234. Therefore, the first portions 234A of the absorption layer 234 overlying the resist patterns 222A are removed simultaneously by the first removal process. In some embodiments, the first removal process includes a wet etching process or other applicable processes. The wet etching process, for example, a photoresist stripping process, may use a photoresist stripper, an aqueous alkaline solution, an amine-solvent mixture, or an organic solvent.

Figure 1G:
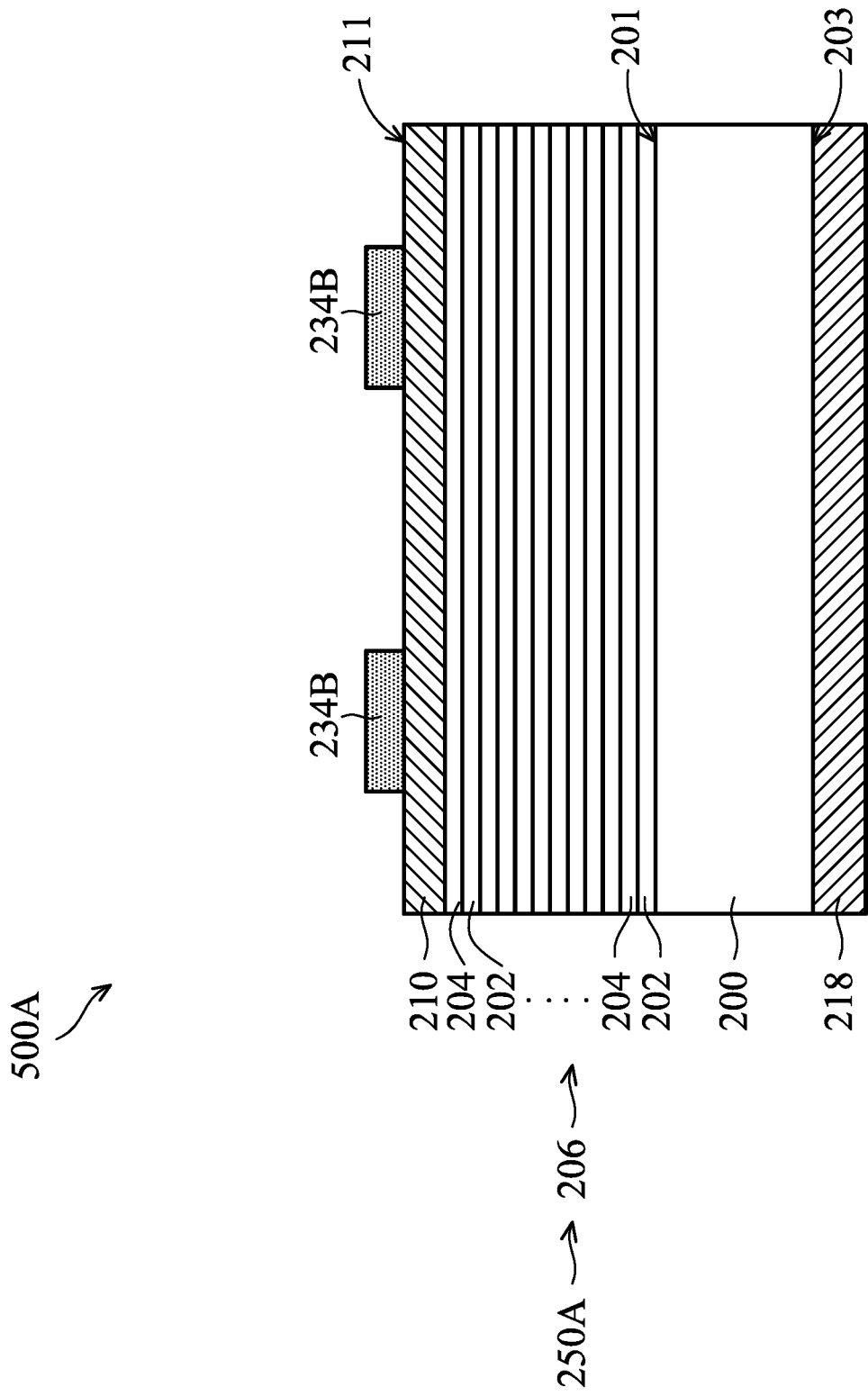

Afterwards, the hard mask patterns 220A, the anti-reflection patterns 216A and the absorption patterns 212A of the sacrificial multilayer patterns 230A are removed to expose the capping layer 210 by a second removal process, as shown in FIG. 1G in accordance with some embodiments. The second removal process may be configured to remove stacks of the hard mask patterns 220A, the anti-reflection patterns 216A and the absorption patterns 212A and stop on the capping layer 210. Therefore, the remaining absorption layer 234 on the capping layer 210 (i.e. the second portions 234B of the absorption layer 234) may form absorption patterns on a portion of the capping layer 210. For example, the second portions 234B of the absorption layer 234 may serve as absorption patterns 234B of the reticle 500A after performing the first removal process and the second removal process. In some embodiments, the second removal process includes a dry etching process. In some embodiments, the etching processes are performed using an etching gas including chlorine ($Cl_2$), fluorine ($F_2$), carbon (C), oxygen ($O_2$), nitrogen ($N_2$), $SF_6$, $CH_3Cl$, $CH_2Cl_2$ or their mixture thereof.

Figure 1H:
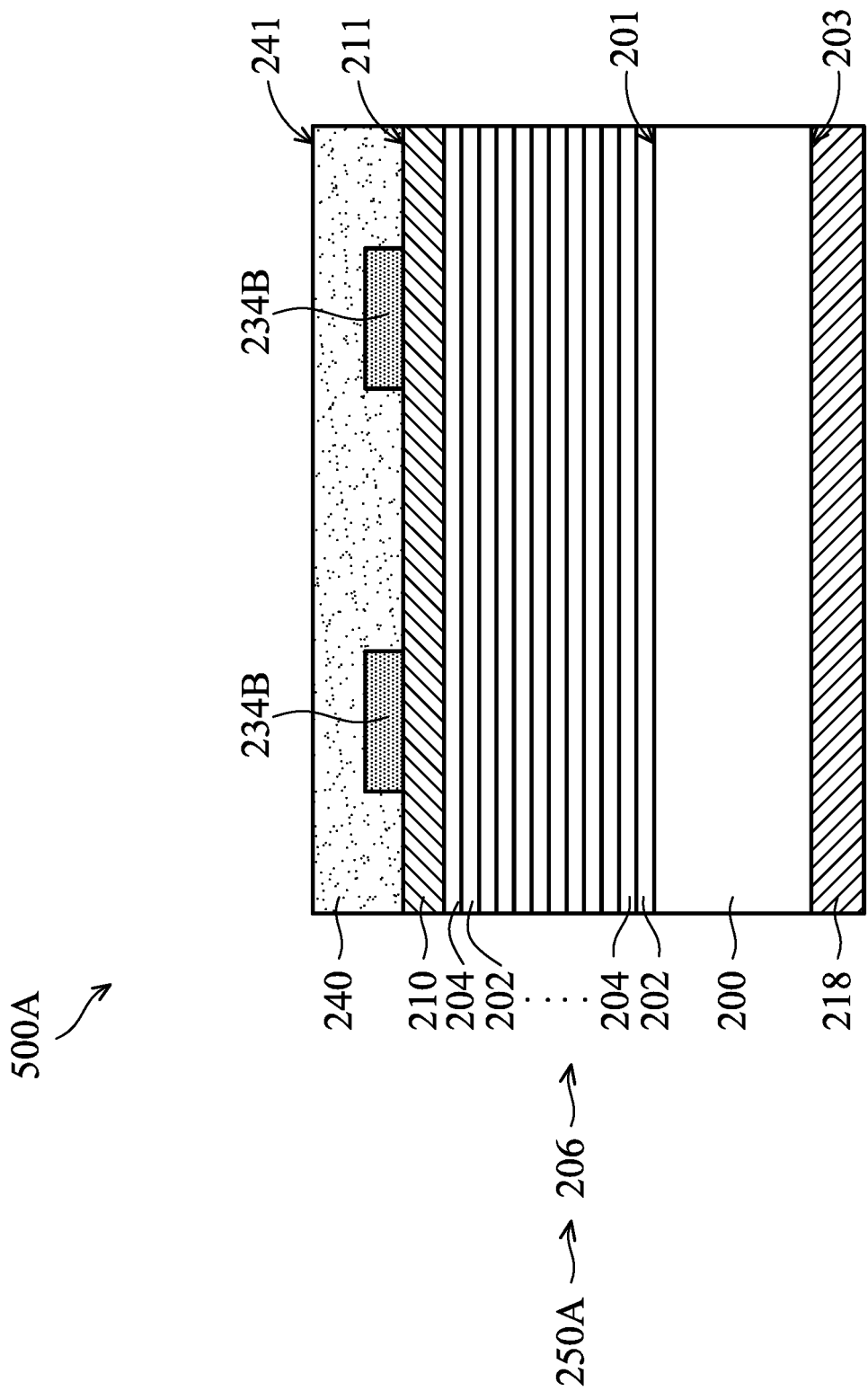

Afterwards, a photoresist layer 240 is formed over the absorption patterns 234B and the capping layer 210 as shown in FIG. 1H in accordance with some embodiments. The photoresist layer 240 may fill gaps between the absorption patterns 234B and have a smooth and even top surface 241. In some embodiments, the photoresist layer 240 includes a positive photoresist and formed by a spin-on coating process followed by a soft baking process.

Figure 1I:
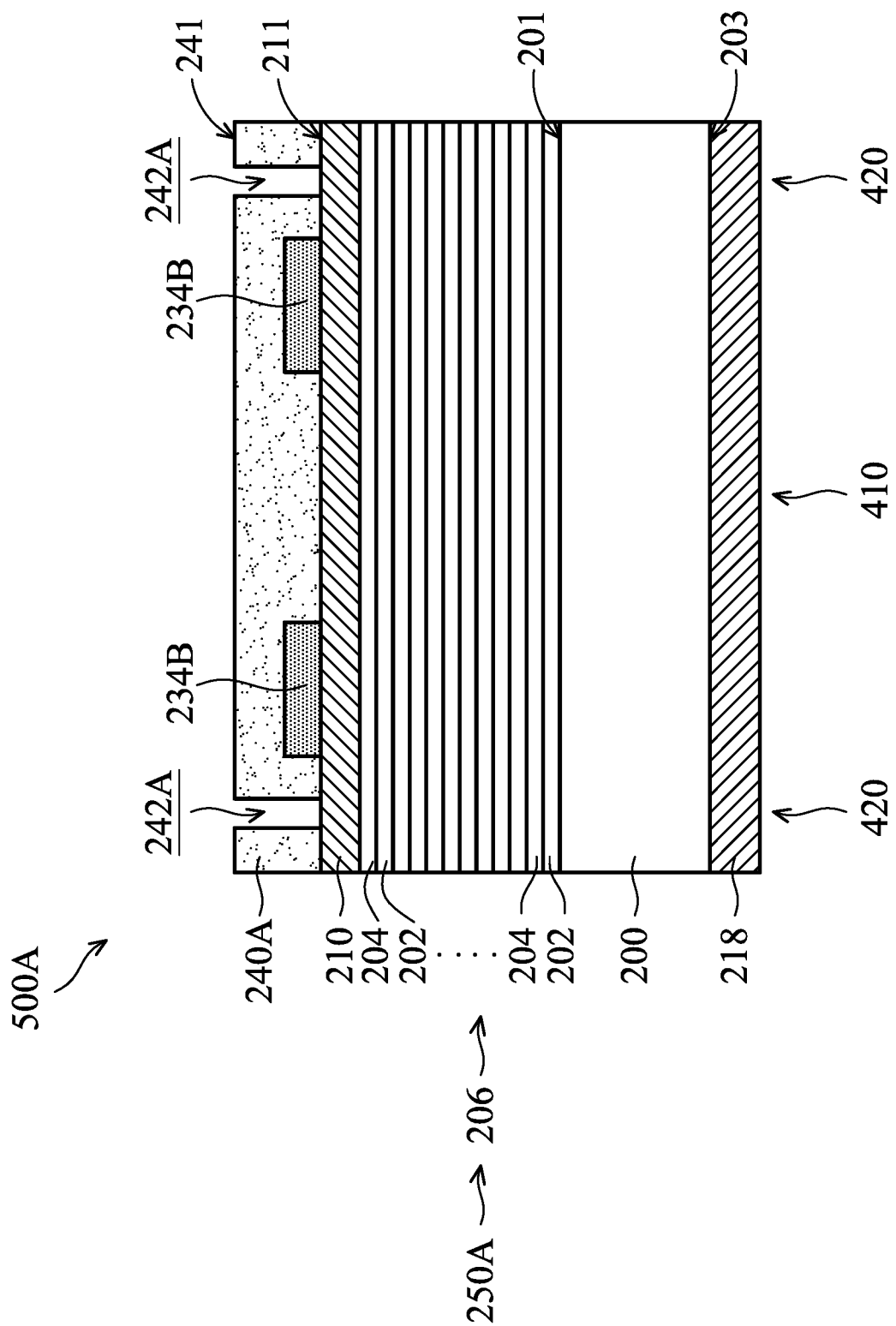

Afterwards, openings 242A are formed in the photoresist layer 240 (FIG. 1H) by a photolithography process, as shown in FIG. 1I in accordance with some embodiments. The openings 242A are formed passing through the photoresist layer 240 to expose the capping layer 210. The opening 242A may be formed surrounding the absorption patterns 234B. In addition, the photoresist layer 240 is patterned to form photoresist patterns 240A shown in FIG. 1I. In some embodiments, the photolithography process includes exposure, post-exposure baking, developing, rinsing, drying (e.g. hard baking), other suitable processes, and/or combinations thereof to form the photoresist patterns 240A. For example, electron, ion, or photon beam direct writing may be used for the exposure step in the mask patterning process.

Figure 1J:
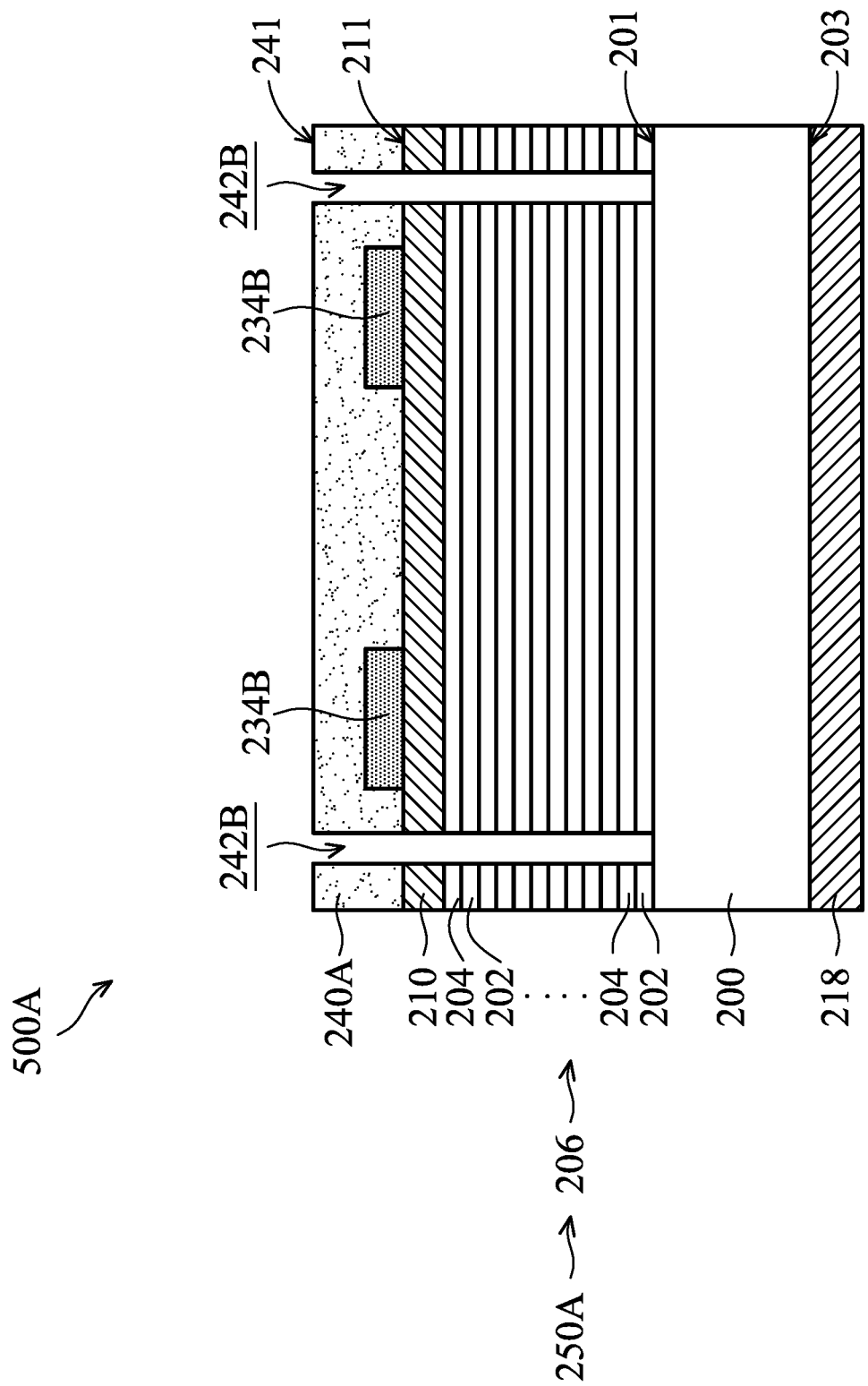

Afterwards, a portion of the capping layer 210 and a portion of the reflective ML 206 are removed to form trenches 242B, as shown in FIG. 1J in accordance with some embodiments. The trenches 242B may be formed by an etching process using the photoresist patterns 240A as an etching mask. The trenches 242B may be formed passing through the capping layer 210 and the reflective ML 206. In addition, the trenches 242B may surround the absorption patterns 234B and expose the top surface 201 of the mask substrate 200. In some embodiments, the etching process includes a dry etching process. After the trenches 242B are formed, the photoresist patterns 240A are removed by a wet etching process or a dry etching process. The wet etching process, for example, a photoresist stripping process, may use a photoresist stripper, an aqueous alkaline solution, an amine-solvent mixture, or an organic solvent. The dry etching for example, an ashing process, may be performed using an etching gas including $SF_6$, $Cl_2$, $CH_3Cl$, $CF_4$, $CH_2Cl_2$, $O_2$, $H_2O$, other radical mixture, or a mixture thereof. In addition, the etching gas may be mixed with $N_2$, $O_2$, NO and/or $H_2O$.

Figure 1K:
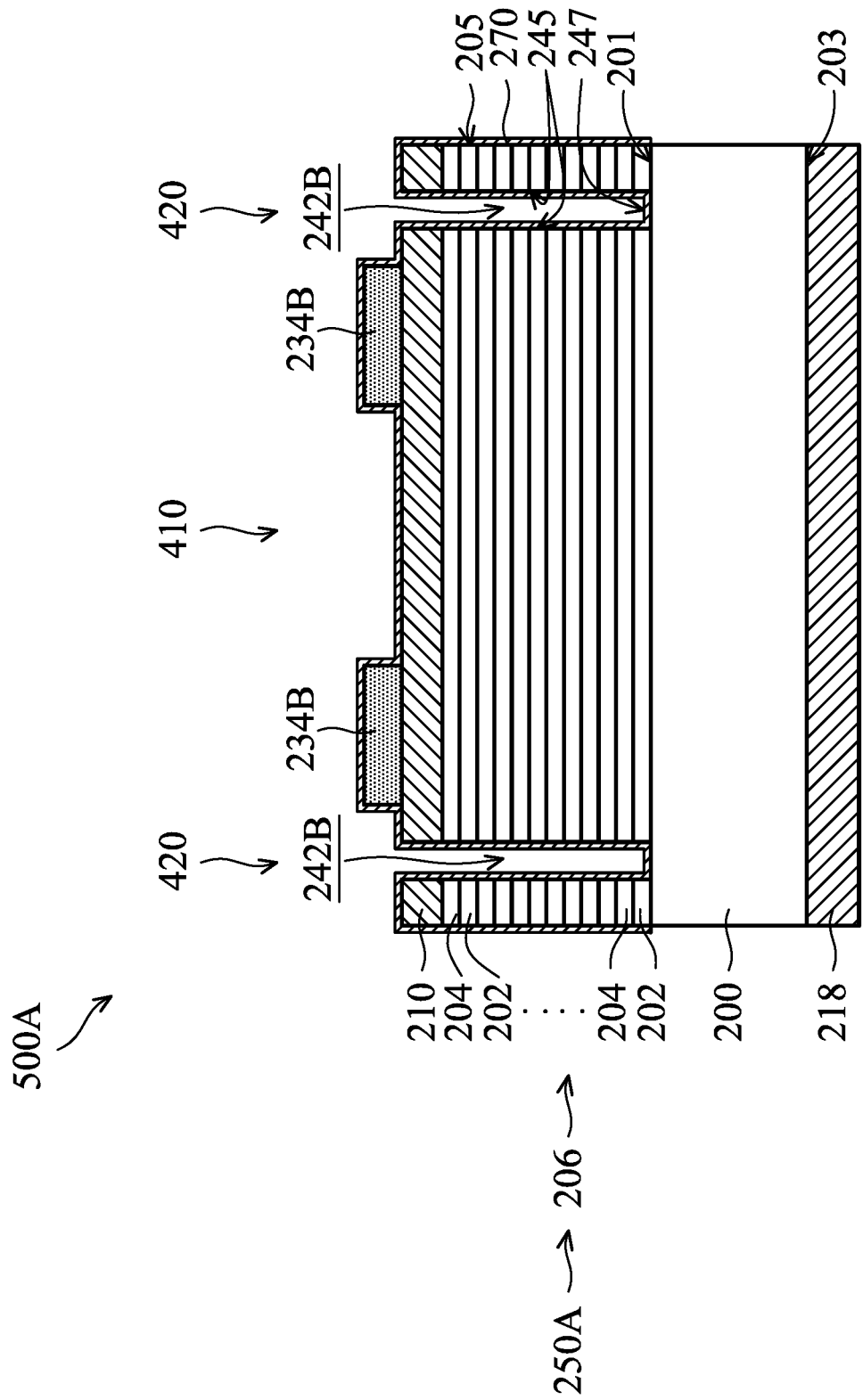

Afterwards, a passivation layer 270 is formed over the absorption patterns 234B and along sidewall surfaces 245 and bottom surfaces 247 of the trenches 242B, as shown in FIG. 1K in accordance with some embodiments. The passivation layer 270 may be conformally formed on the absorption patterns 234B and the capping layer 210. In addition, the passivation layer 270 may be formed on a sidewall surface 205 of a stack including the reflective ML 206 and the capping layer 210 positioned outside the trenches 242B. The passivation layer 270 is configured to prevent the absorption patterns 234B of the resulting reticle 500A from contamination. In some other embodiments, the passivation layer 270 is optional.

In some embodiments, the passivation layer 270 is formed of materials having high absorption of EUV light to eliminate the undesired reflection. In addition, the passivation layer 270 may be formed of materials having high hydrogen radical-resistant for purposes of cleaning contaminants on the reticle. For example, the passivation layer 270 may be formed of silicon nitride (SiN), silicon oxynitride (SiON), boron (B), ruthenium (Ru), or another suitable material. For example, the passivation layer 270 may include a plurality of film pairs, such as molybdenum-silicon (Mo/Si) film pairs (e.g. a layer of molybdenum above or below a layer of silicon in each film pair).

In some embodiments, the passivation layer 270 is formed by a plasma treatment process, a sol-gel process, a photochemical reaction process an atomic layer deposition (ALD) process, or another applicable process. For example, the plasma treatment process may be performed to expose the absorption patterns 234B, the capping layer 210, the sidewall surfaces 245 and the bottom surfaces 247 of the trenches 242B to a nitrogen-based gas selected from the group of $N_2$, $NH_3$, $N_2H_3$ and $NO_2$ to form the passivation layer 270.

After performing the aforementioned processes, the reticle 500A is formed, as shown in FIG. 1K in accordance with some embodiments.

In some embodiments, the reticle 500A includes a pattern portion 410 and a border portion 420, in a cross-sectional view shown in FIG. 1K. In some embodiments, the pattern portion 410 is located in the center portion of the reticle 500A. Therefore, absorption patterns 234B positioned within the pattern portion 410 may serve as reticle patterns of the reticle 500A. The border portion 420 may surround the pattern portion 410. The passivation layer 270 may be conformally formed on top surfaces and sidewall surfaces of the pattern portion 410 and the border portion 420. In addition, the pattern portion 410 is separated from the border portion 420 by the trench 242B. The trench 242B may fully surround or partially surround the pattern portion 410. For example, when the trench 242B partially surrounds the pattern portion 410, a portion of the reticle 500A in contact with the pattern portion 410 and the border portion 420 may serve as a bridge portion (not shown). In some embodiments, the bridge portion may be positioned between the pattern portion 410 and the border portion 420 and connected to a portion of the pattern portion 410 and a portion of the border portion 420.

In some embodiments, the process for manufacturing the reticle 500A including using sacrificial multilayer patterns 230A to block a portion of the capping layer 210. In addition, the exposed portion of the capping layer 210 and the sacrificial multilayer patterns 230A are positioned in different levels. Therefore, the desired absorption layer 234 may be formed in several separated portions (e.g. the first portions 234A and the second portions 234B) respectively on the exposed portion of the capping layer 210 and on the sacrificial multilayer patterns 230A. Therefore, the resulting absorption patterns 234B may be formed by removing the sacrificial multilayer patterns 230A along with the portions of the absorption layer (the first portions 234A) above the sacrificial multilayer patterns 230A. The absorption layer 234 may be patterned as absorption patterns 234B the without using an etching mask and the subsequent etching process. Furthermore, the material of the absorption patterns 234B may have a high extinction coefficient (k) (e.g. in a range from about 0.04 to about 0.09). The thickness of the absorption patterns 234B of the reticle 500A may be reduced further (e.g. to a range from about 20 nm to about 40 nm) to reduce or eliminate the mask shadowing effect during the exposure process. In addition, the depth of focus (DOF) of the reticle 500A may be reduced.

Figure 2A:
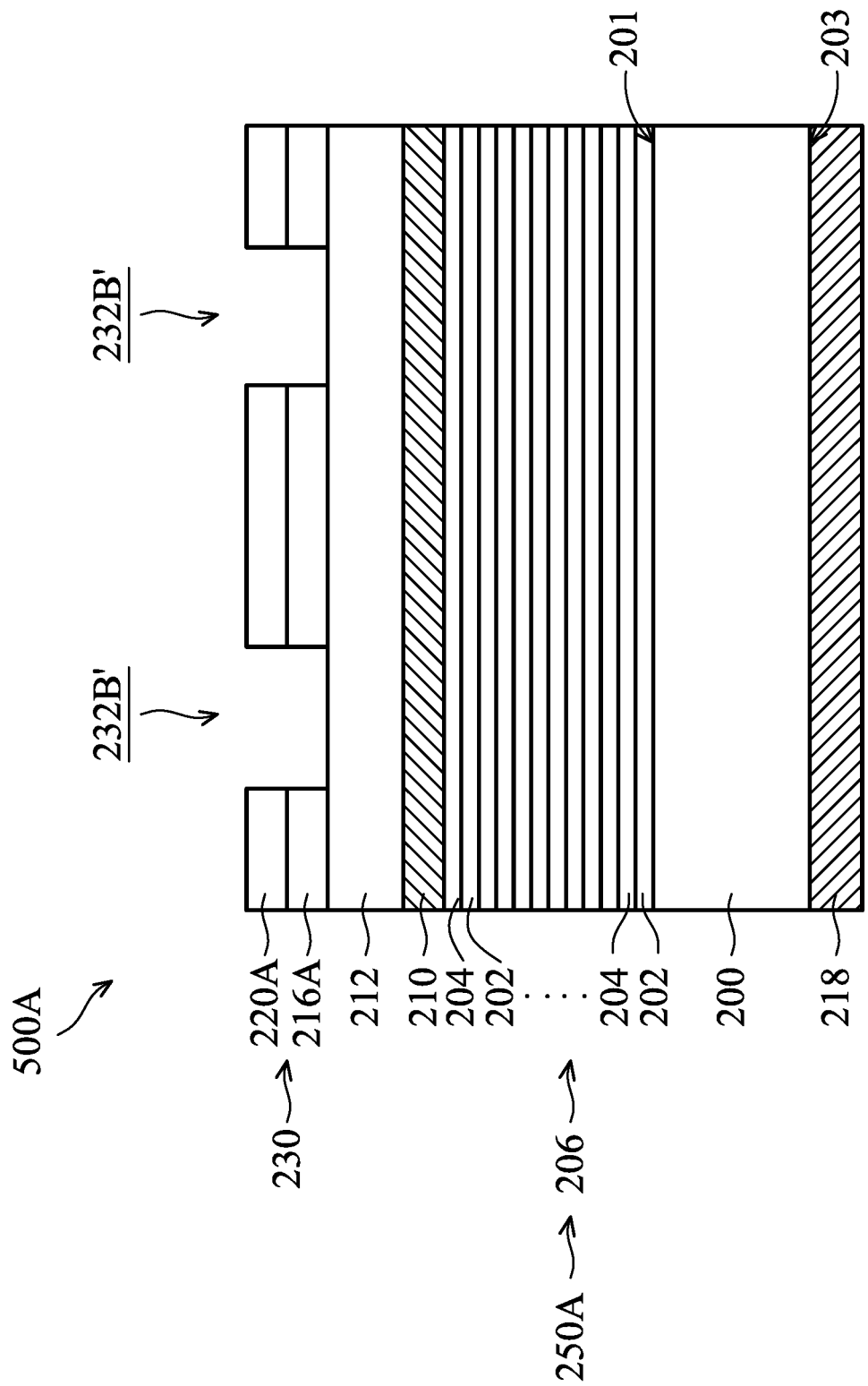
FIGS. 2A-2C are cross-sectional views of various stages of a process for manufacturing a reticle structure, in accordance with some embodiments.
Figure 2B:
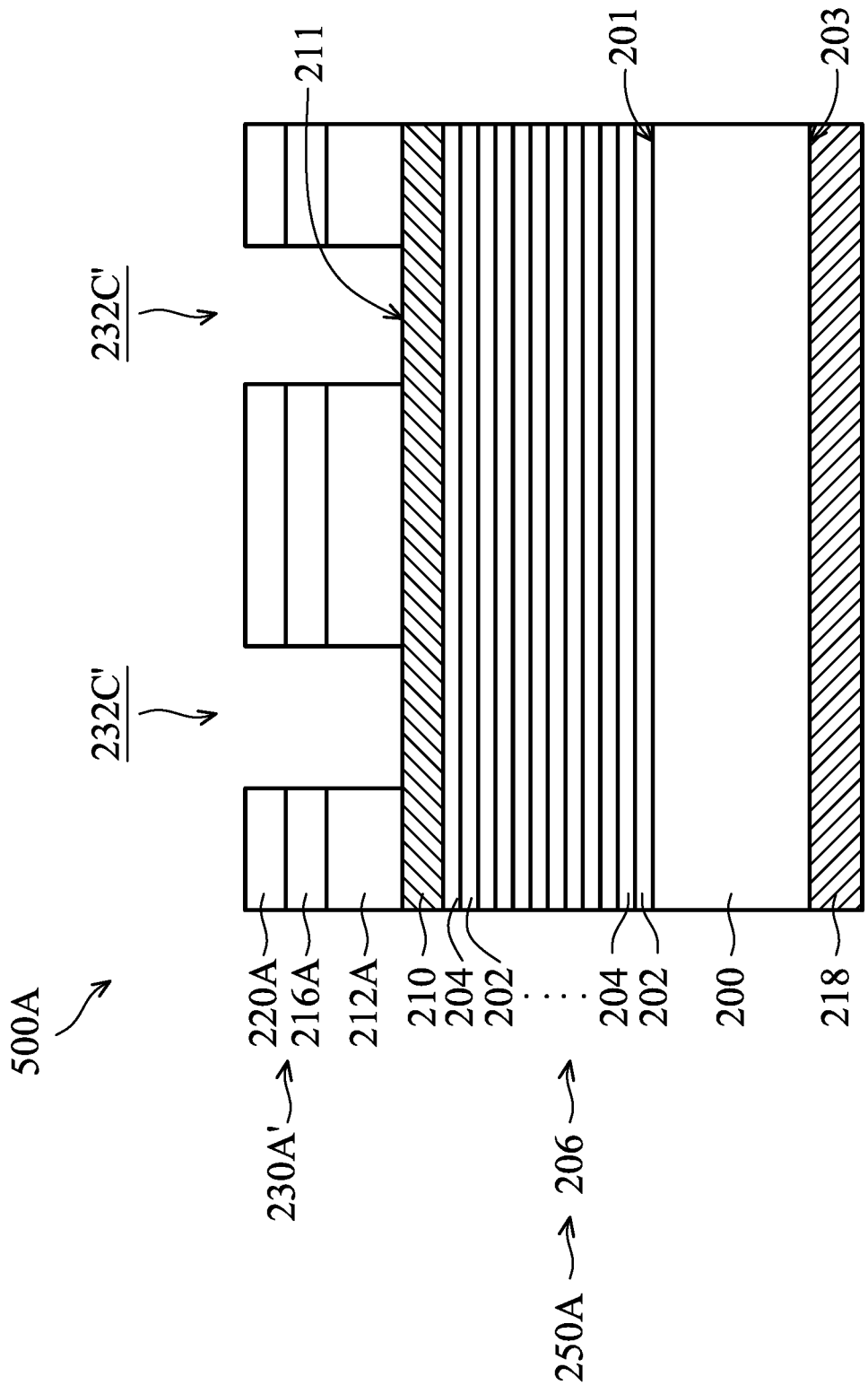
Figure 2C:
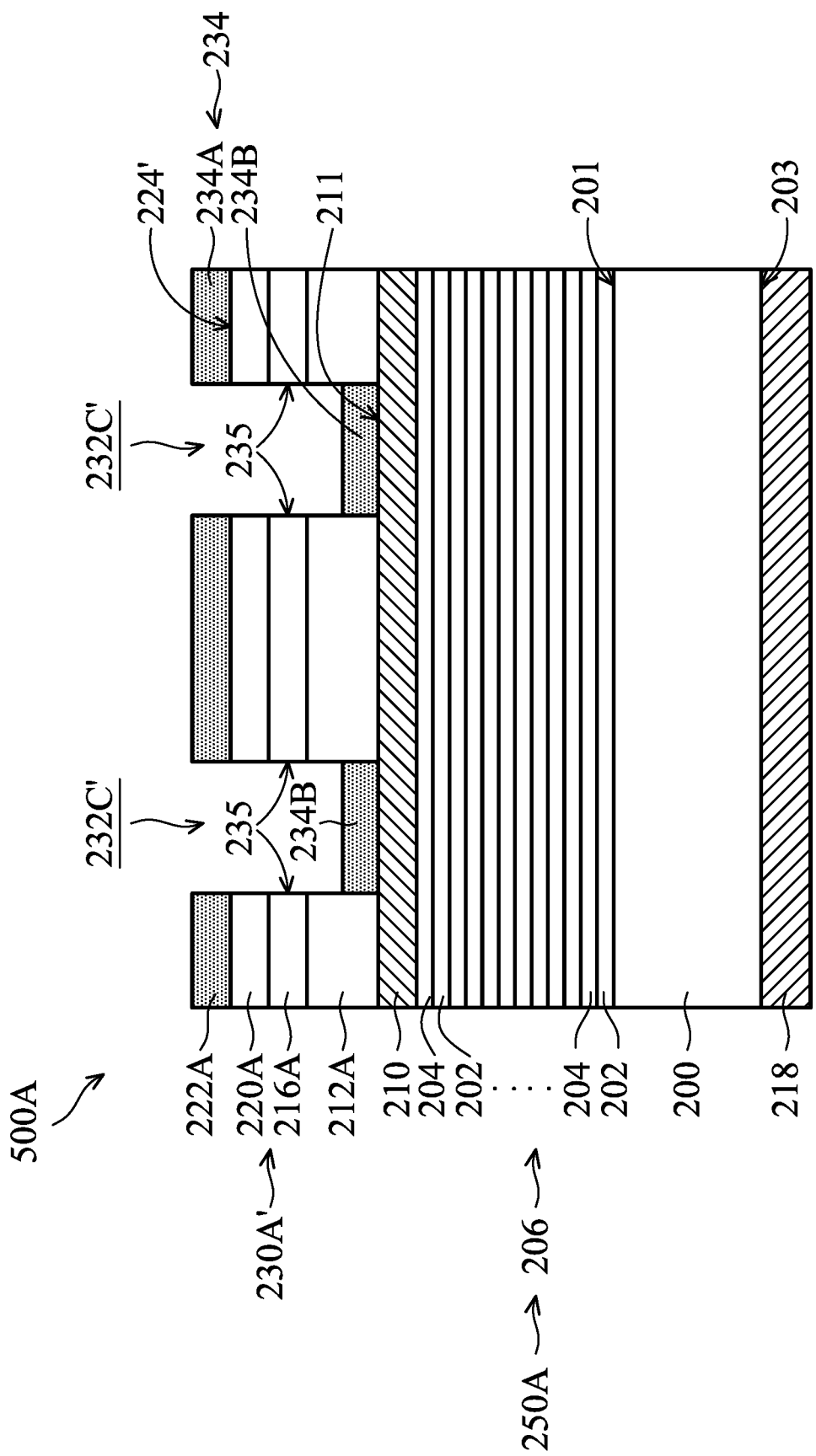

FIGS. 2A-2C are cross-sectional views of various stages of a process for manufacturing the reticle 500A after performing the stage of the process for forming a reticle 500A shown in FIG. 1C. The process shown in FIGS. 2A-2C may provide an improved resolution of the photolithography process of the resulting absorption patterns of the reticle.

After the hard mask patterns 220A are formed, the resist patterns 222A (FIG. 1C) are removed from the hard mask patterns 220A, as shown in FIG. 2A in accordance with some embodiments. In some embodiments, the resist patterns 222A are removed by a removal process includes a wet etching process or other applicable processes. The wet etching process, for example, a photoresist stripping process, may use a photoresist stripper, an aqueous alkaline solution, an amine-solvent mixture, or an organic solvent.

Afterwards, a clean process may be performed to clean the surface of the hard mask patterns 220A. In some embodiments, the cleaning process includes a plasma pre-cleaning process or a wet cleaning process. Afterwards, a portion of the anti-reflection layer 216 (FIG. 1C) that is not covered by the underlying hard mask patterns 220A is removed by an etching process. The etching process of the anti-reflection layer 216 may stop on the absorption layer 212 to form openings 232B' passing through the anti-reflection layer 216 (FIG. 1C). In addition, the anti-reflection layer 216 is patterned to form the anti-reflection patterns 216A.

Afterwards, a portion of the absorption layer 212 that is not covered by the hard mask patterns 220A and anti-reflection patterns 216A is removed by another etching process, as shown in FIG. 2B in accordance with some embodiments. The etching process of the absorption layer 212 may stop on the capping layer 210. In addition, the etching processes of the absorption layer 212 may form openings 232C' in the absorption layer 212 (FIG. 2A). The openings 232C' are formed passing through the absorption layer 212 to expose the capping layer 210. In addition, the absorption layer 212 is patterned to form absorption patterns 212A shown in FIG. 2B.

As shown in FIG. 2B, stacks of the hard mask patterns 220A, the anti-reflection patterns 216A and the absorption patterns 212A may be used to form sacrificial multilayer patterns 230A' covering a portion of the top surface 211 of the capping layer 210. In some embodiments, the removal of the resist patterns 222A can prevent the sacrificial multilayer patterns from the undesired pattern collapse problem. Therefore, the resolution of the photolithography process of the absorption patterns may be improved.

Afterwards, the absorption layer 234 is formed over the patterned sacrificial multilayer (e.g. the sacrificial multilayer patterns 230A') and covering the capping layer 210 in the openings 232C by a deposition process, as shown in FIG. 2C in accordance with some embodiments. The absorption layer 234 may include one or more first portions 234A and one or more second portions 234B. The first portions 234A of the absorption layer 234 may be formed in contact with top surfaces 224' of the sacrificial multilayer patterns 230A'. In addition, the second portions 234B of the absorption layer 234 may be formed in contact with the top surface 211 of the capping layer 210 and sidewall surfaces 235 of the sacrificial multilayer patterns 230A'.

Afterwards, the processes shown in FIGS. 1G-1K are performed to form the reticle 500A, as shown in FIG. 1K in accordance with some embodiments. In some embodiments, the removal process of the photoresist patterns shown in FIG. 2A can prevent the sacrificial multilayer patterns from the undesired pattern collapse problem. Therefore, the resolution of the photolithography process of the absorption patterns may be improved.

Figure 3A:
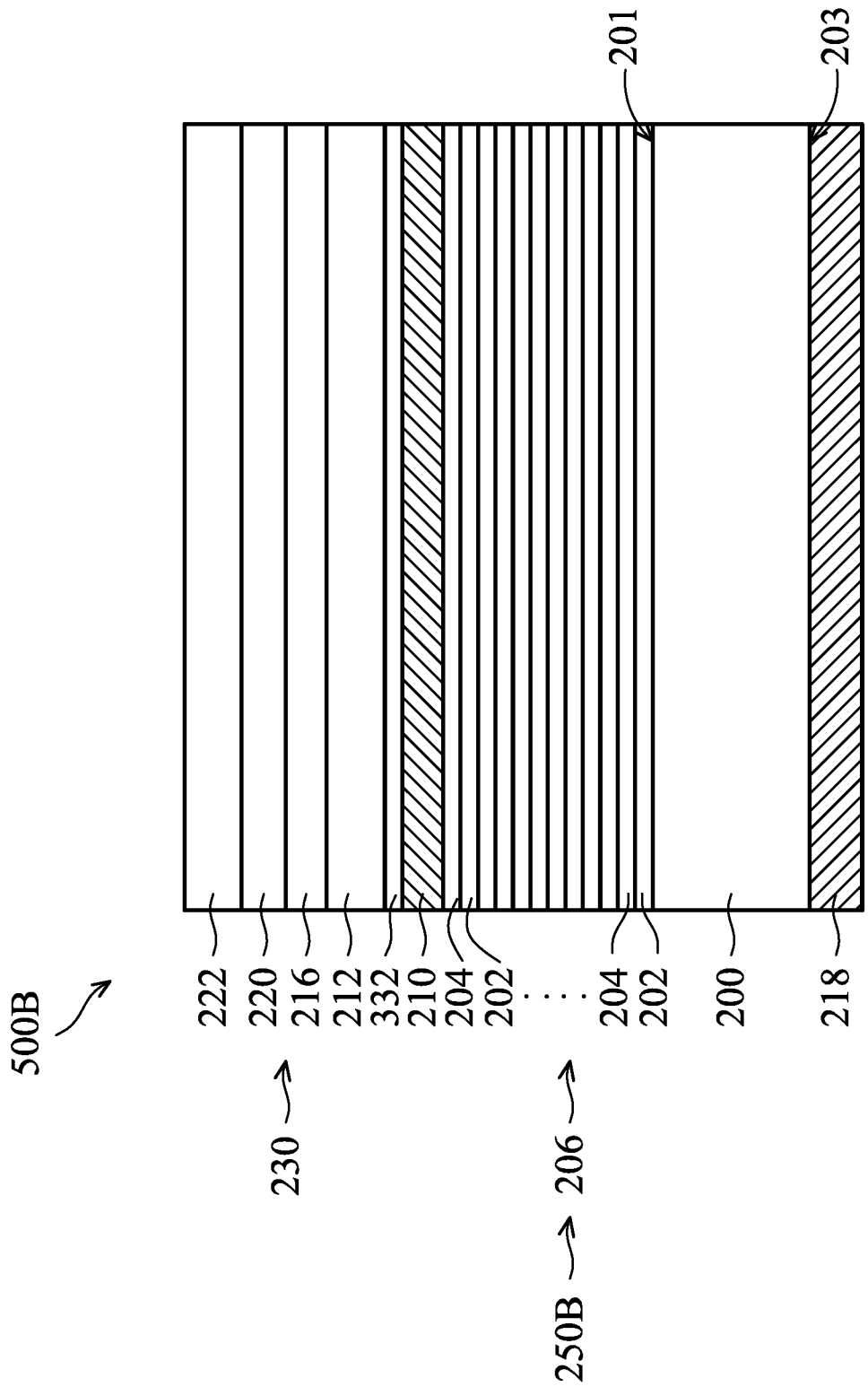
FIGS. 3A-3D are cross-sectional views of various stages of a process for manufacturing a reticle structure, in accordance with some embodiments.
Figure 3B:
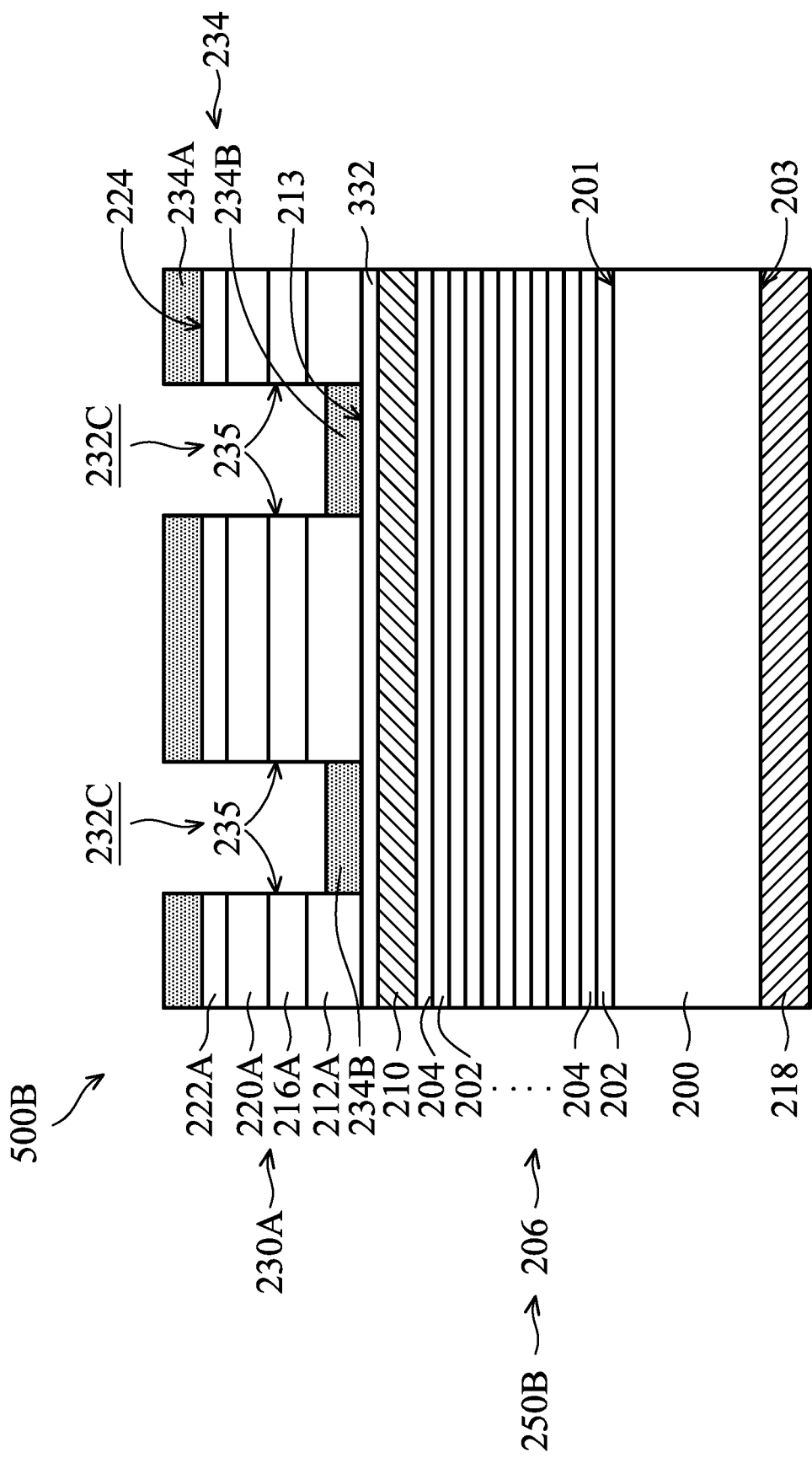
Figure 3C:
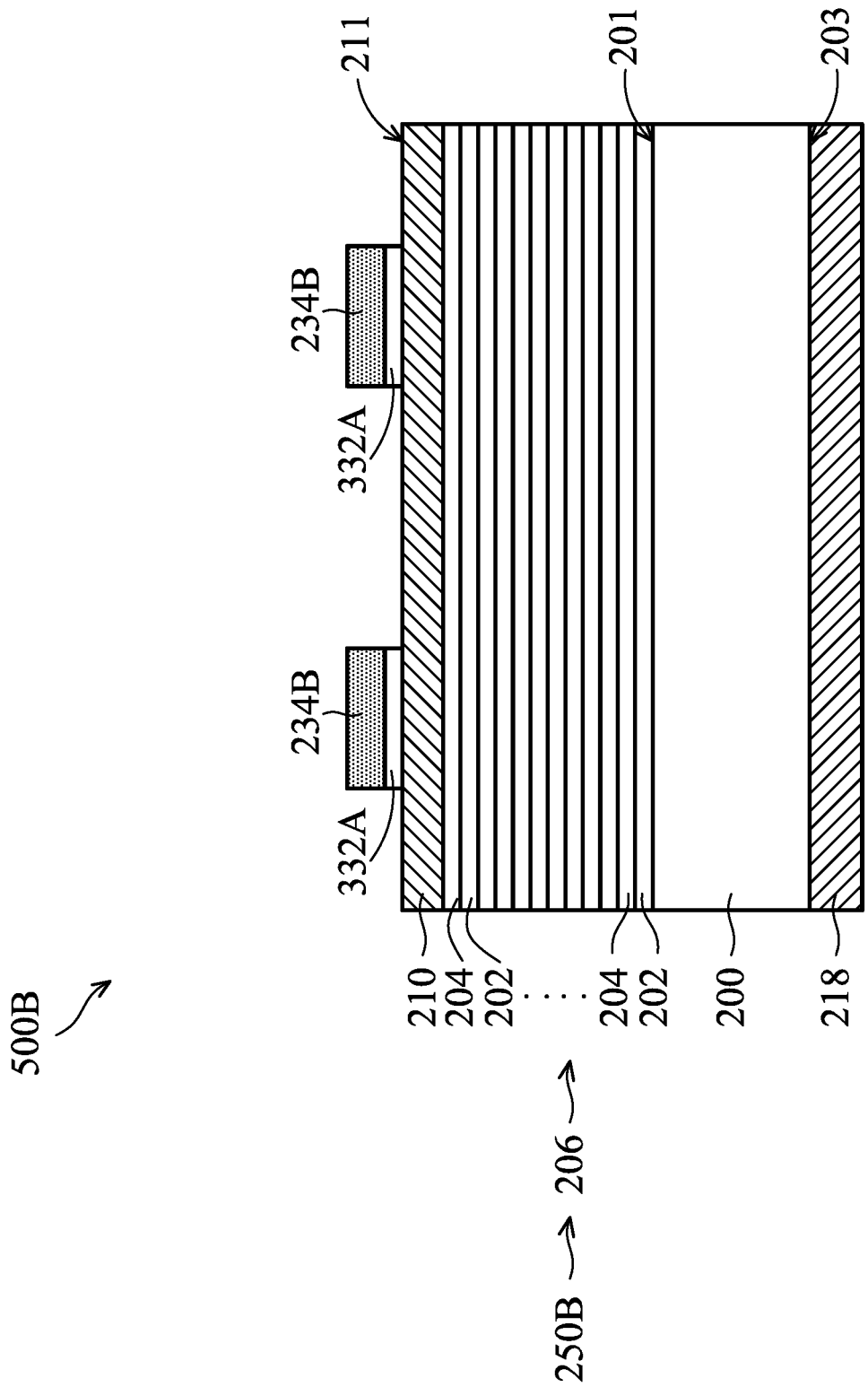

FIGS. 3A-3C are cross-sectional views of various stages of a process for manufacturing a reticle 500B, in accordance with some embodiments. The materials, configurations, structures and/or processes of the reticle 500B may be similar to, or the same as, those of the reticle 500A, and the details thereof are not repeated herein. One of the differences between the reticle 500A and the reticle 500B is that a blank reticle 250B of the reticle 500B includes an adhesion layer 332 between the capping layer 210 and the absorption layer 212.

As shown in FIG. 3A, the reflective multilayer ML 206 may be formed over the front-side surface 201 of the mask substrate 200. The capping layer 210 may be formed over the reflective multilayer ML 206. The materials, configurations, structures and/or processes of the mask substrate 200, the reflective multilayer (ML) 206, the capping layer 210 of the blank reticle 250B may be similar to, or the same as, those of the mask substrate 200, the reflective multilayer (ML) 206, the capping layer 210 of the blank reticle 250A, and the details thereof are not repeated herein.

Afterwards, the adhesion layer 332 is deposited over the capping layer 210, as shown in FIG. 3A in accordance with some embodiments. The adhesion layer 332 may be configured to improve adhesion between the capping layer 210 and the subsequent absorption layer 212. In addition, the adhesion layer 332 may help to detect the end point in the etching process of the absorption layer 212.

In some embodiments, the adhesion layer 332 is formed of chromium (Cr), chromium oxide, chromium nitride, titanium (Ti), titanium oxide, titanium nitride (TiN), tantalum (Ta), tantalum oxide, tantalum nitride (TaN), tantalum oxynitride or a combination thereof. In addition, the adhesion layer 332 may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used.

Afterwards, the absorption layer 212 is deposited over the adhesion layer 332. After performing the aforementioned blank reticle fabrication processes, the blank reticle 250B is formed, as shown in FIG. 3A in accordance with some embodiments. In some embodiments, the blank reticle 250B includes the mask substrate 200, the reflective multilayer (ML) 206, the capping layer 210, the adhesion layer 332 and the absorption layer 212.

Afterwards, the sacrificial multilayer 230 is formed over the capping layer 210 of the blank reticle 250B, as shown in FIG. 3A in accordance with some embodiments. In some embodiments, the sacrificial multilayer 230 includes the absorption layer 212 of the blank reticle 250B, the anti-reflection layer 216, the hard mask layer 220 and the resist layer 222.

Afterwards, the processes shown in FIGS. 1B-1D are performed to form the sacrificial multilayer patterns 230A on the adhesion layer 332, as shown in FIG. 3B in accordance with some embodiments. The sacrificial multilayer patterns 230A covering a portion of a top surface 213 of the adhesion layer 332. The sacrificial multilayer patterns 230A may prevent the reticle patterns of the resulting reticle 500B from forming on the blocked portion of the adhesion layer 332 in the subsequent processes. In addition, a remaining portion of the adhesion layer 332 that is not covered by the sacrificial multilayer patterns 230A may be provided to allow the reticle patterns (e.g. the absorption patterns 234B shown in FIG. 3B) to be formed thereon.

Afterwards, the absorption layer 234 is formed over the patterned sacrificial multilayer (e.g. the sacrificial multilayer patterns 230A) and covering the adhesion layer 332 in the openings 232C by a deposition process, as shown in FIG. 3B in accordance with some embodiments. The first portions 234A of the absorption layer 234 may be formed in contact with top surfaces 224 of the sacrificial multilayer patterns 230A. In addition, the second portions 234B of the absorption layer 234 may be formed in contact with the top surface 213 of the adhesion layer 332 and sidewall surfaces 235 of the sacrificial multilayer patterns 230A.

Afterwards, the processes shown in FIGS. 1F-1G are performed to form the absorption patterns (i.e. the second portions 234B of the absorption layer 234) over the capping layer 210, as shown in FIG. 3C in accordance with some embodiments. In addition, the second removal process (FIG. 1G) may be configured to further remove adhesion layer 332 that is not covered by the second portions 234B of the absorption layer 234. Therefore, the adhesion patterns 332A are formed directly under the corresponding absorption patterns (i.e. the second portions 234B of the absorption layer 234). The absorption patterns (i.e. the second portions 234B of the absorption layer 234) may be separated from the capping layer 210 through the adhesion 332A.

Figure 3D:
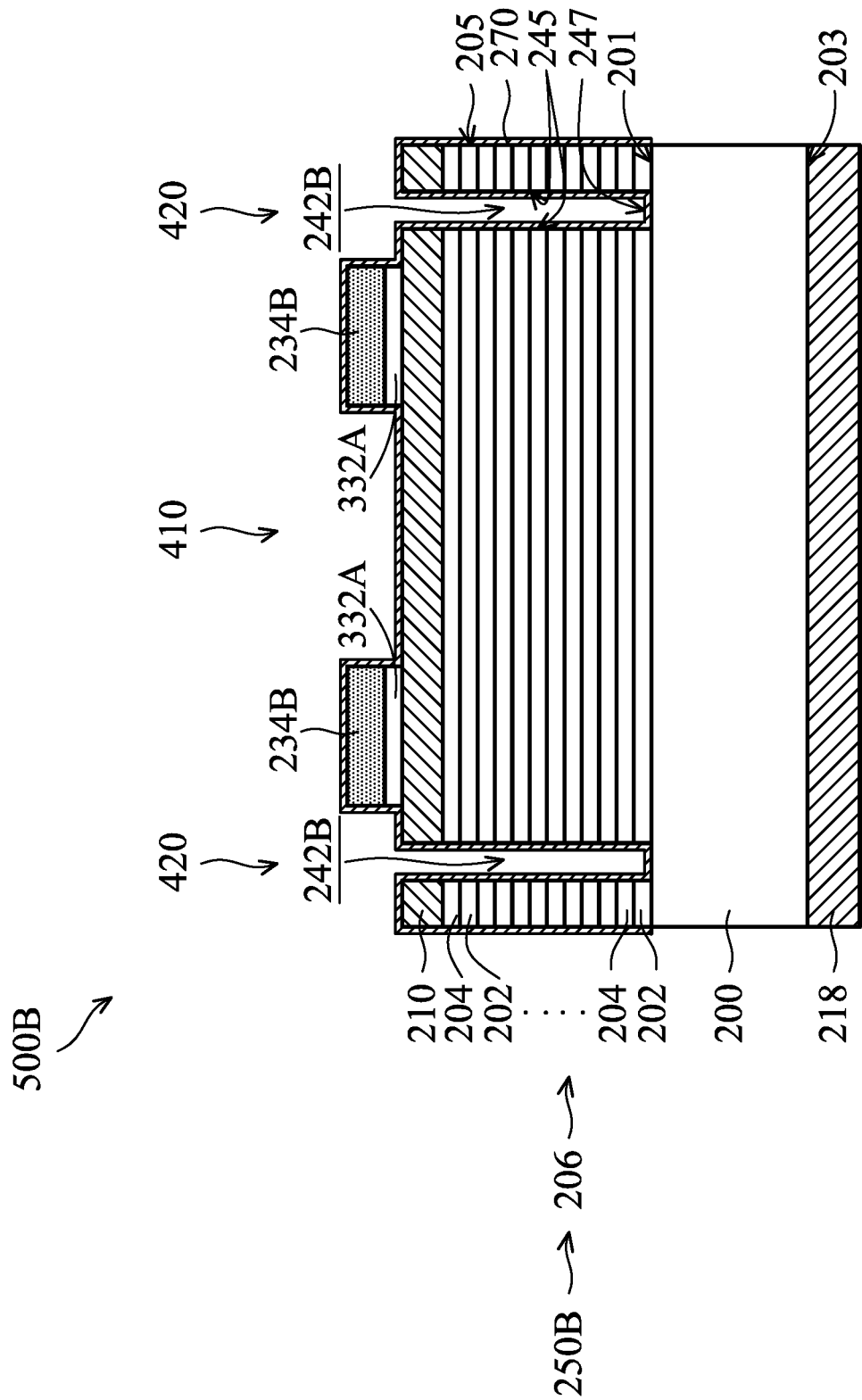

Afterwards, the processes shown in FIGS. 1H-1K are performed to form the reticle 500B, as shown in FIG. 3D in accordance with some embodiments. The adhesion 332A may be configured to improve adhesion between the capping layer 210 and the subsequent absorption patterns (i.e. the second portions 234B of the absorption layer 234). In addition, the adhesion layer 332 may help to detect the end point in the etching process of the absorption layer 212.

Figure 4A:
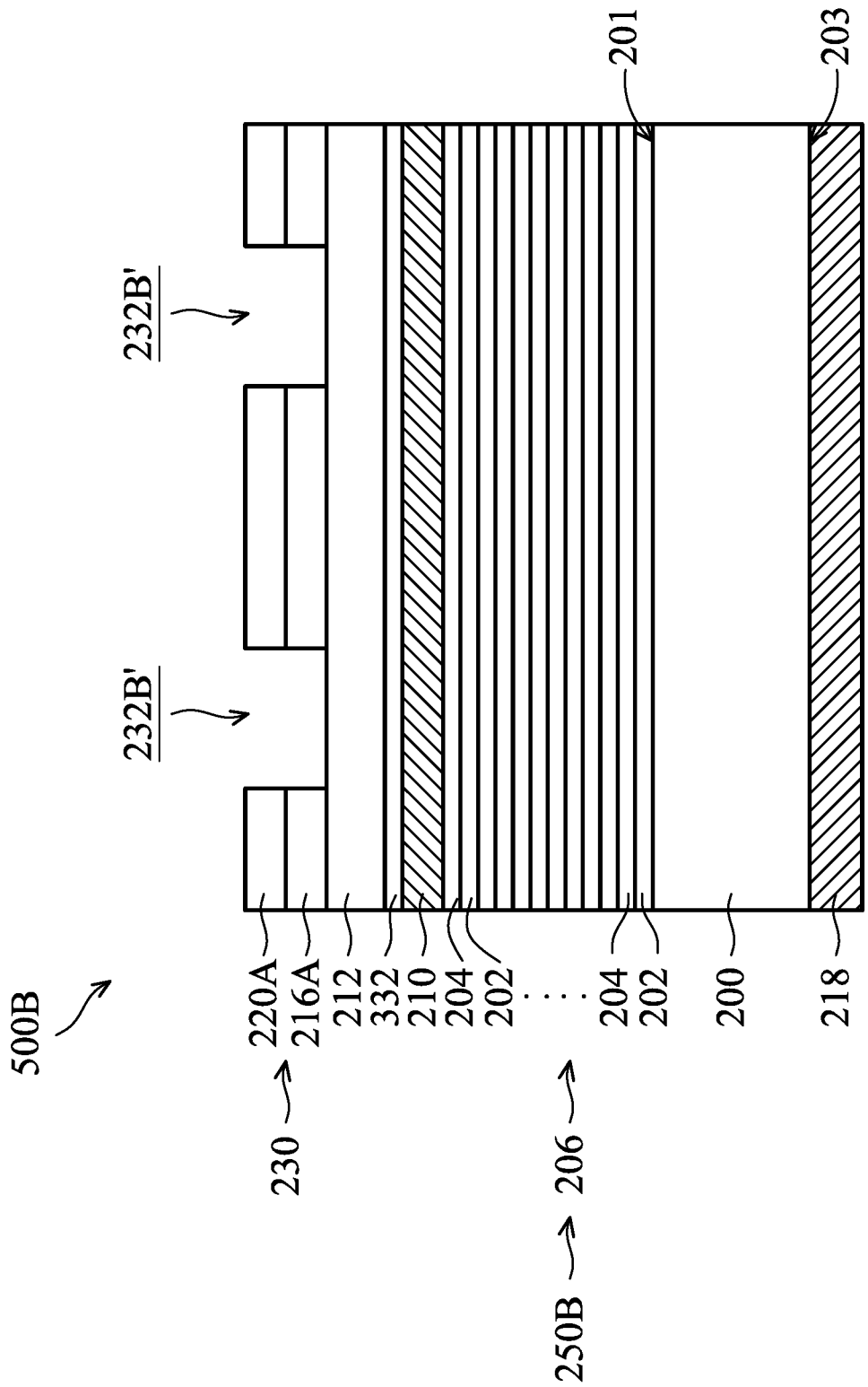
FIGS. 4A-4C are cross-sectional views of various stages of a process for manufacturing a reticle structure, in accordance with some embodiments.
Figure 4B:
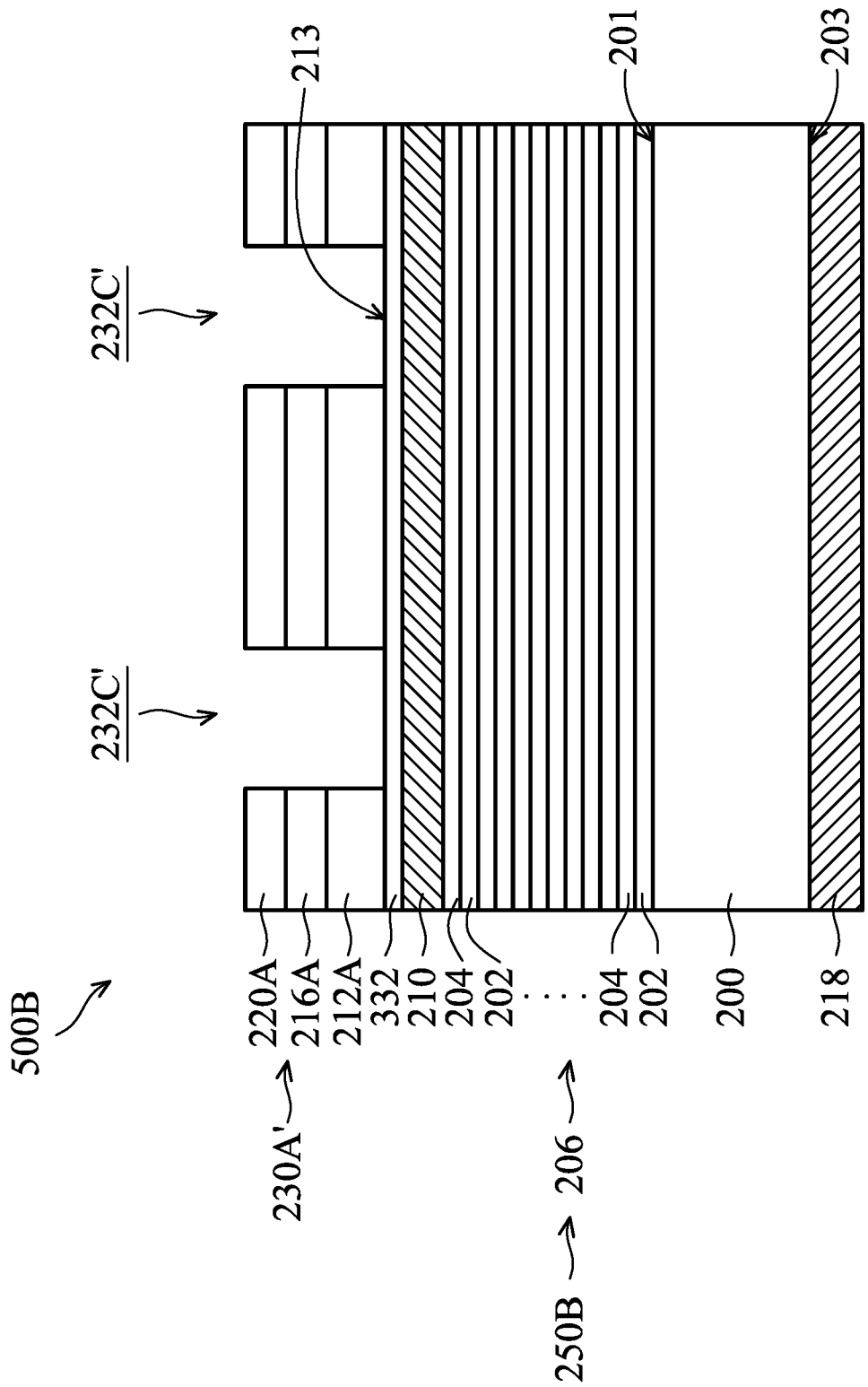
Figure 4C:
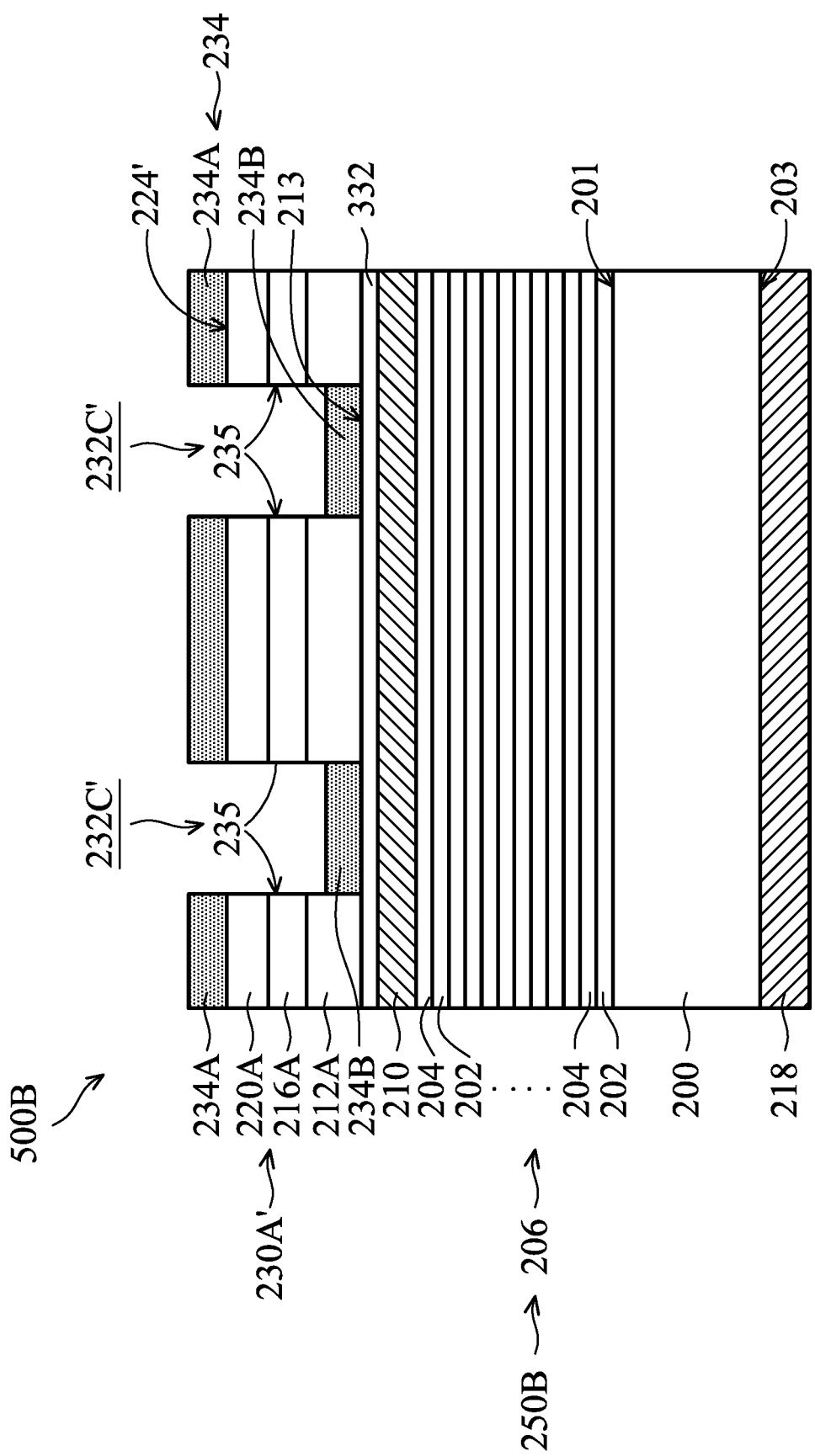

FIGS. 4A-4C are cross-sectional views of various stages of a process for manufacturing the reticle 500B after performing the stage of the process for forming the reticle 500B shown in FIG. 3A. The process shown in FIGS. 4A-4C may provide an improved resolution of the photolithography process of the absorption patterns.

After the hard mask patterns 220A are formed, the resist patterns (formed by patterning the resist layer 222 shown in FIG. 3A) are removed from the hard mask patterns 220A, as shown in FIG. 4A in accordance with some embodiments. In some embodiments, the resist patterns are removed by a removal process similar to, or the same as, those of the removal process of the resist patterns 222A (FIG. 1C) shown in FIG. 2A, and the details thereof are not repeated herein.

Afterwards, the anti-reflection patterns 216A are formed by an etching process using the hard mask patterns 220A as etching mask patterns. In some embodiments, the etching process are similar to, or the same as, those of the etching process of the anti-reflection layer 216 (FIG. 1C) shown in FIG. 2A, and the details thereof are not repeated herein.

Afterwards, the etching process shown in FIG. 2B is performed to form the sacrificial multilayer patterns 230A' covering a portion of the top surface 213 of the adhesion layer 332, as shown in FIG. 4B in accordance with some embodiments. In some embodiments, the removal of the photoresist patterns can prevent the sacrificial multilayer patterns from the undesired pattern collapse problem. Therefore, the resolution of the photolithography process of the absorption patterns may be improved.

Afterwards, the deposition process shown in FIG. 2C is performed to form the absorption layer 234 over the patterned sacrificial multilayer (e.g. the sacrificial multilayer patterns 230A') and covering the adhesion layer 332 in the openings 232C', as shown in FIG. 4C in accordance with some embodiments. The first portions 234A of the absorption layer 234 may be formed in contact with top surfaces 224 of the sacrificial multilayer patterns 230A'. In addition, the second portions 234B of the absorption layer 234 may be formed in contact with the top surface 213 of the adhesion layer 332 and sidewall surfaces 235 of the sacrificial multilayer patterns 230A'.

Afterwards, the processes shown in FIGS. 1F-1K are performed to form the reticle 500B, as shown in FIG. 3D in accordance with some embodiments. The adhesion layer 332 may be configured to improve adhesion between the capping layer 210 and the subsequent absorption patterns (i.e. the second portions 234B of the absorption layer 234). In addition, the adhesion layer 332 may help to detect the end point in the etching process of the absorption layer 212.

FIGS. 5A-5E are cross-sectional views of various stages of a process for manufacturing a reticle 500C, in accordance with some embodiments. The materials, configurations, structures and/or processes of the reticle 500C may be similar to, or the same as, those of the reticle 500A, and the details thereof are not repeated herein. One of the differences between the reticle 500A and the reticle 500C is that a blank reticle 250C of the reticle 500C includes the adhesion layer 332 between the capping layer 210 and an absorption layer 334.

Figure 5A:
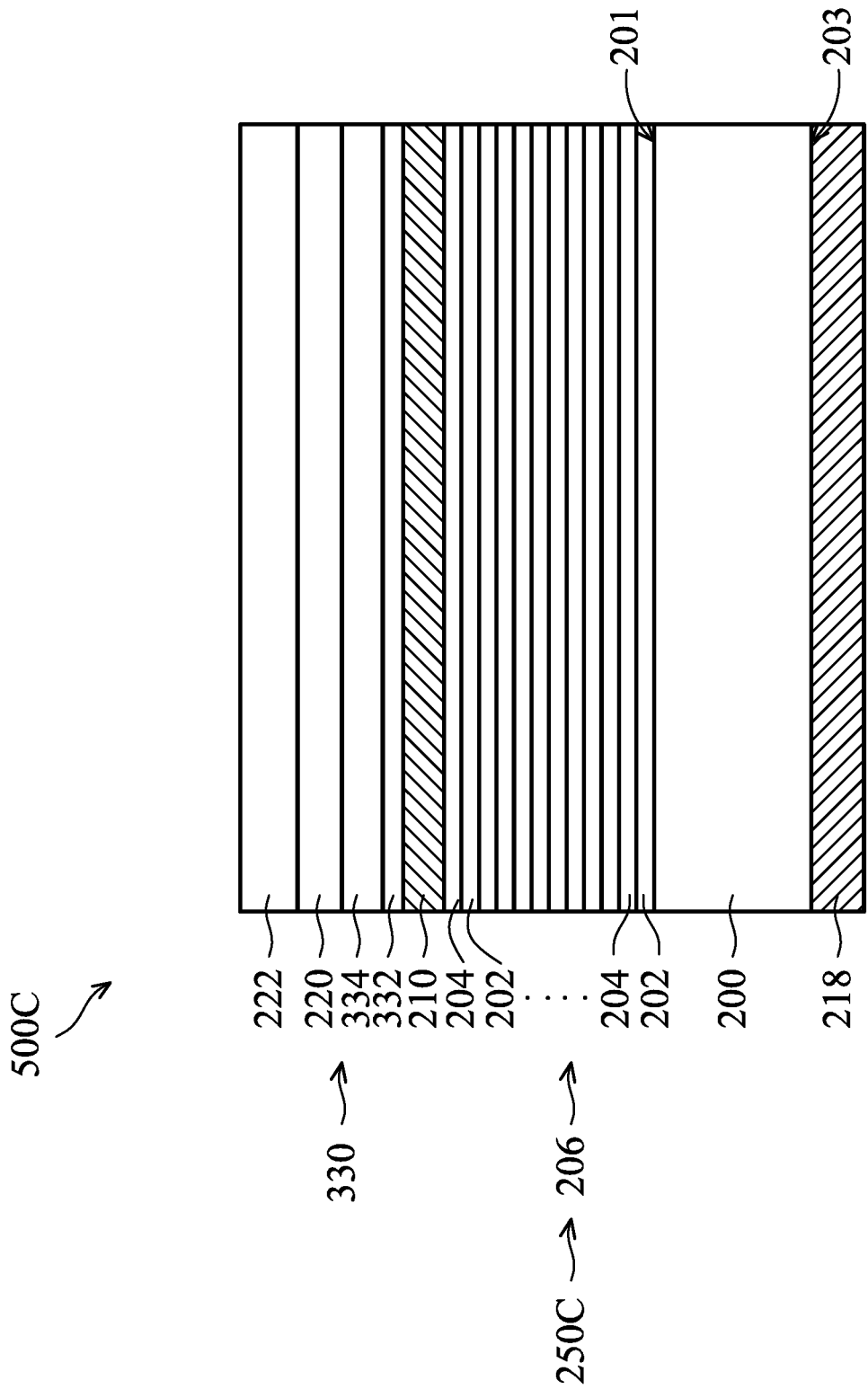
FIGS. 5A-5E are cross-sectional views of various stages of a process for manufacturing a reticle structure, in accordance with some embodiments.

As shown in FIG. 5A, the reflective multilayer ML 206 may be formed over the front-side surface 201 of the mask substrate 200. The capping layer 210 may be formed over the reflective multilayer ML 206. The adhesion layer 332 is deposited over the capping layer 210. The materials, configurations, structures and/or processes the mask substrate 200, the reflective multilayer (ML) 206, the capping layer 210 and the adhesion layer 332 of the blank reticle 250C may be similar to, or the same as, those of the mask substrate 200, the reflective multilayer (ML) 206, the capping layer 210 and the adhesion layer 332 of the blank reticle 250B, and the details thereof are not repeated herein.

Afterwards, an absorption layer 334 is deposited over the adhesion layer 332, as shown in FIG. 5A in accordance with some embodiments. The materials, configurations, structures and/or processes of the absorption layer 334 may be similar to, or the same as, those of the absorption layer 234 (FIG. 1E), and the details thereof are not repeated herein.

After performing the aforementioned blank reticle fabrication processes, the blank reticle 250C is formed, as shown in FIG. 5A in accordance with some embodiments. In some embodiments, the blank reticle 250C includes the mask substrate 200, the reflective multilayer (ML) 206, the capping layer 210, the adhesion layer 332 and the absorption layer 334.

Afterwards, a sacrificial multilayer 330 is formed over the absorption layer 334 of the blank reticle 250C, as shown in FIG. 5A in accordance with some embodiments. In some embodiments, the sacrificial multilayer 330 includes a hard mask layer 220 and a resist layer 222. The hard mask layer 220 may be formed over the absorption layer 334. In addition, the resist layer 222 may be formed over the hard mask layer 220. The materials, configurations, structures and/or processes of the hard mask layer 220 and resist layer 222 shown in FIG. 5A may be similar to, or the same as, those of the hard mask layer 220 and resist layer 222 shown in FIG. 1A, and the details thereof are not repeated herein.

Figure 5B:
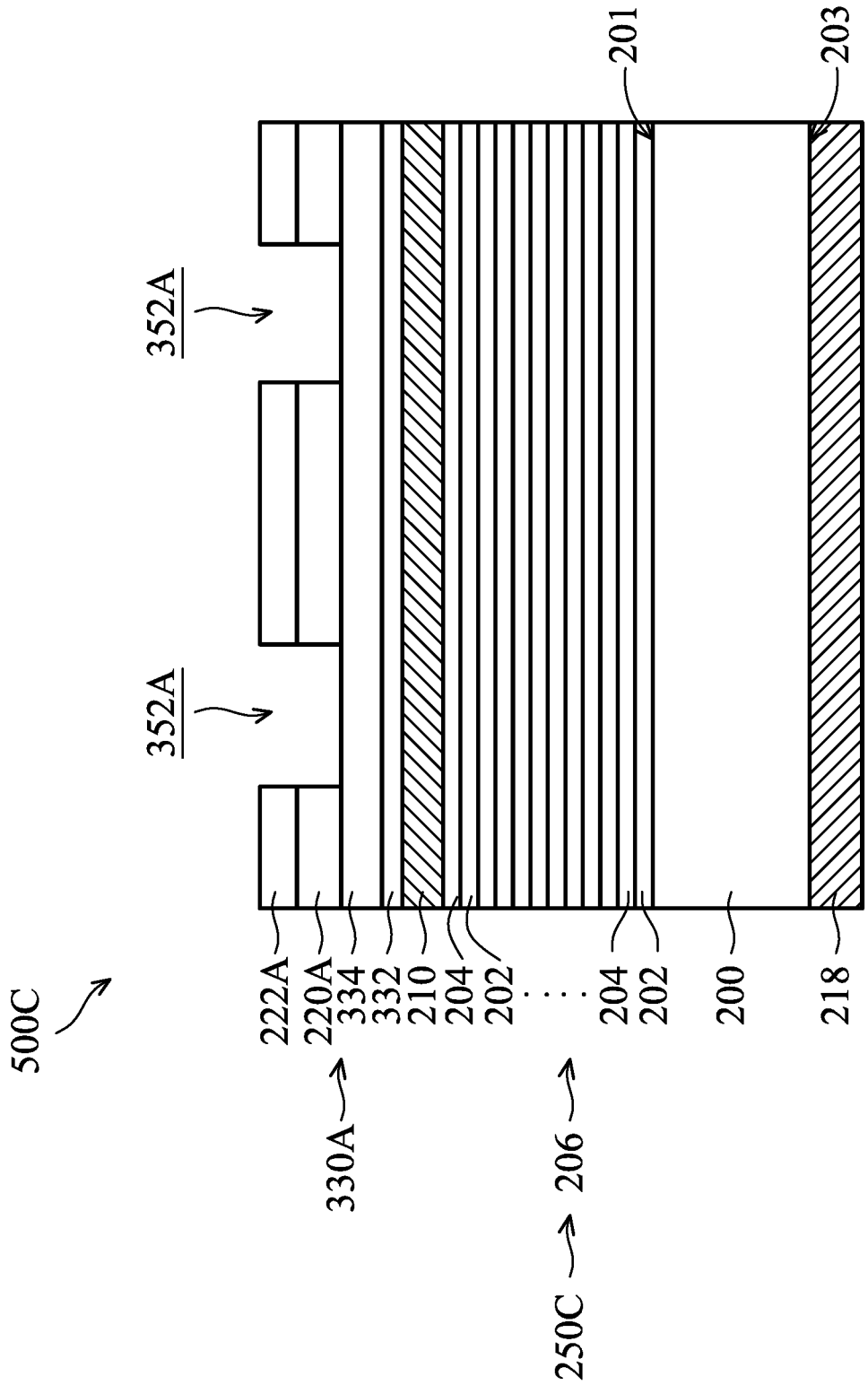

Afterwards, resist patterns 222A and hard mask patterns 220A are formed over the absorption layer 334 by a patterning process, as shown in FIG. 5B in accordance with some embodiments. Openings 352A are formed passing through the sacrificial multilayer 330 (the resist layer 222 and the hard mask layer 220 shown in FIG. 5A) to expose a portion of the absorption layer 334. Therefore, the sacrificial multilayer 330 is patterned to form sacrificial patterns 330A shown in FIG. 5B.

In some embodiments, the patterning process includes a photolithography process (or an etching process) of the resist layer 222 and an etching process of the hard mask layer 220. The patterning process of the resist layer 222 may be configured to form the resist patterns 222A. The etching process of the hard mask layer 220 may stop on the absorption layer 334 and form hard mask patterns 220A. The patterning process of the resist layer 222 and the etching process of the hard mask layer 220 shown in FIG. 5B may be similar to, or the same as, those shown in FIGS. 1B and 1C, and the details thereof are not repeated herein.

Figure 5C:
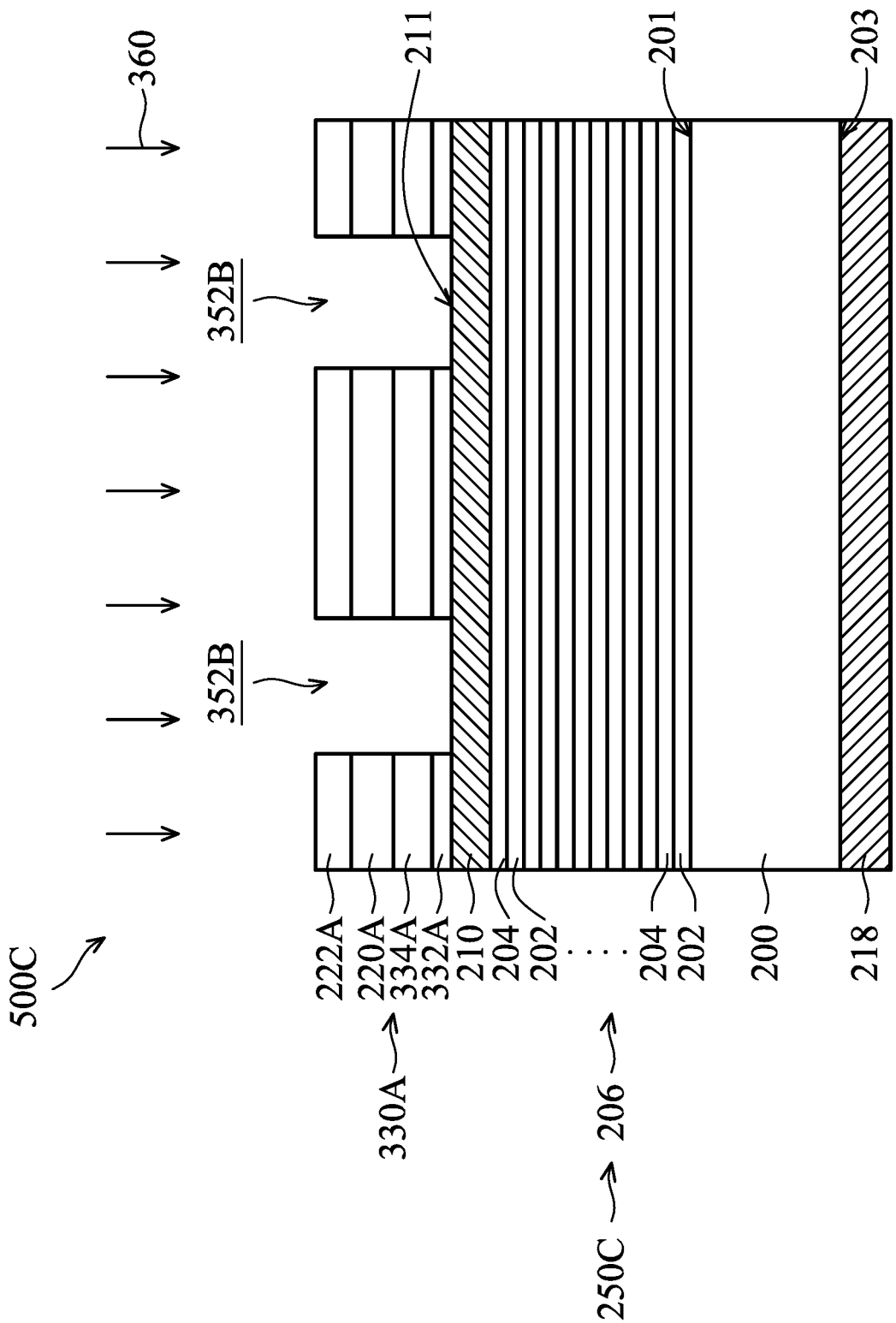

Afterwards, a portion of the absorption layer 334 and a portion of the adhesion layer 332 may be formed by an etching process 360, as shown in FIG. 5C in accordance with some embodiments. The etching process may use stacks of the resist patterns 222A and the hard mask patterns 220A as a mask to remove the absorption layer 334 and the adhesion layer 332 that are not covered by the resist patterns 222A and the hard mask patterns 220A.

During the etching process 360, the adhesion layer 332 may be provided for detecting the transition of the signal between the absorption layer 334 and the underlying adhesion layer 332. In addition, the adhesion layer 332 may help to detect the end point of the absorption layer 334 in the etching process 360. Therefore, the etching process 360 may be controlled to stop on the capping layer 210. The openings 352B may be formed passing through the absorption layer 334 and the adhesion layer 332 to expose the capping layer 210. In addition, the absorption layer 334 is patterned to form absorption patterns 334A. Furthermore, the adhesion layer 332 is patterned to form adhesion patterns 332A after performing the etching process 360. The absorption patterns 334A may be formed overlying and in contact with the adhesion patterns 332A. The adhesion patterns 332A may be formed in contact with the top surface 211 of the capping layer 210.

In some embodiments, the etching process 360 includes a dry etching process. In some embodiments, the etching process 360 is performed using an etching gas including chlorine ($Cl_2$), fluorine ($F_2$), carbon (C), oxygen ($O_2$), nitrogen ($N_2$), $SF_6$, $Cl_2$, $CH_3Cl$, $CF_4$, $CH_2Cl_2$, $O_2$, $H_2O$ or a mixture thereof. In addition, the resist patterns 222A (FIG. 5B) may be etched out after performing the etching process 360 of the absorption layer 334 and the adhesion layer 332.

Figure 5D:
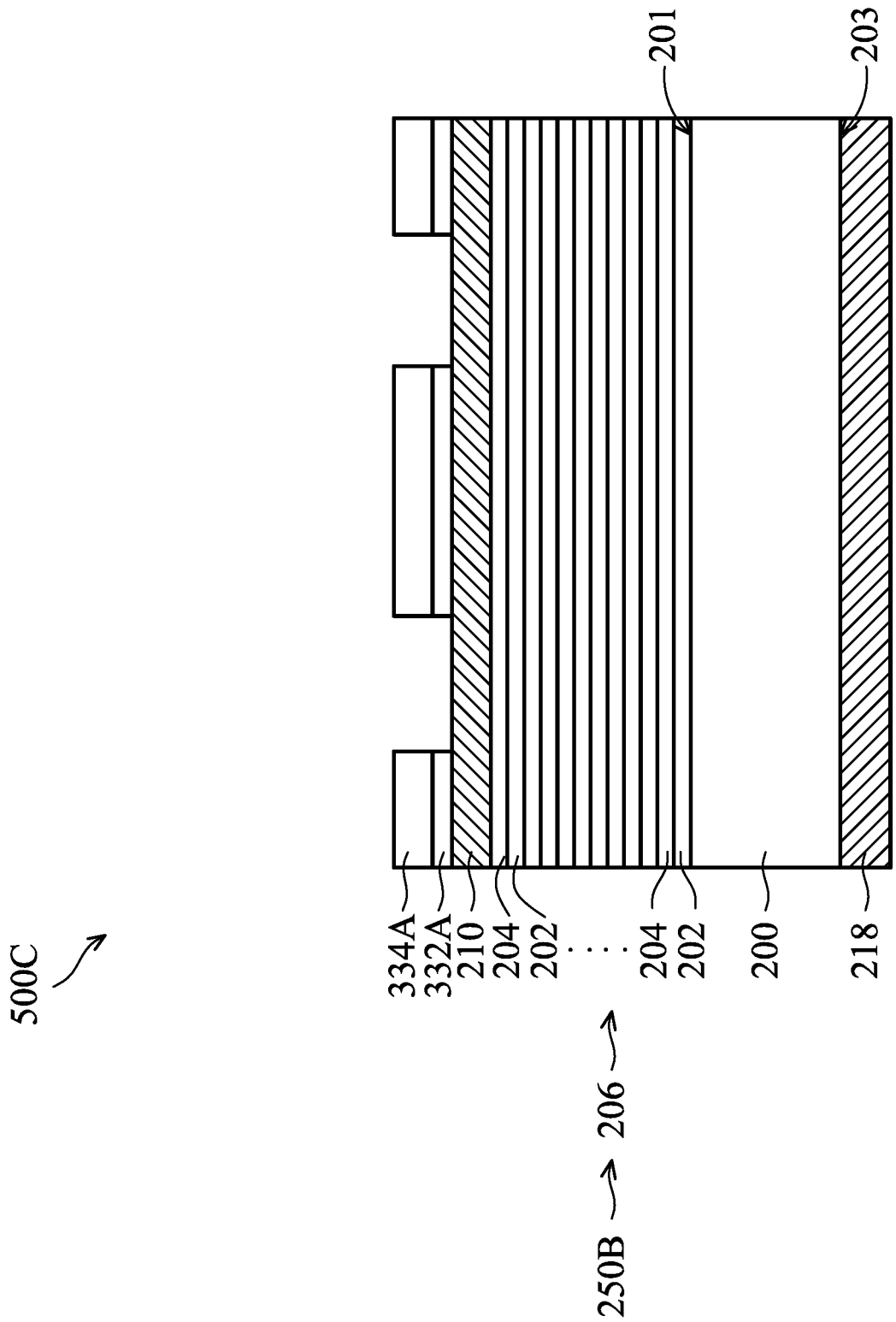

Afterwards, the hard mask patterns 220A are removed to expose the absorption patterns 334A and the adhesion patterns 332A by an etching process, as shown in FIG. 5D in accordance with some embodiments. In some embodiments, the etching process includes a dry etching process. In some embodiments, the etching process includes a dry etching process performed using halogen-based gas, for example, $Cl_2$, $CHF_3$, $CH_3F$, $C_4F_8$, $CF_4$, $SF_6$, $CF_3Cl$, $SF_6$, $Cl_2$, $CH_3Cl$, $CF_4$, $CH_2Cl_2$, $O_2$, $H_2O$, other radical mixture or a mixture thereof. After the hard mask patterns 220A are removed, the absorption patterns 334A and the corresponding adhesion patterns 332A may form several stacks covering a portion of the capping layer 210.

Figure 5E:
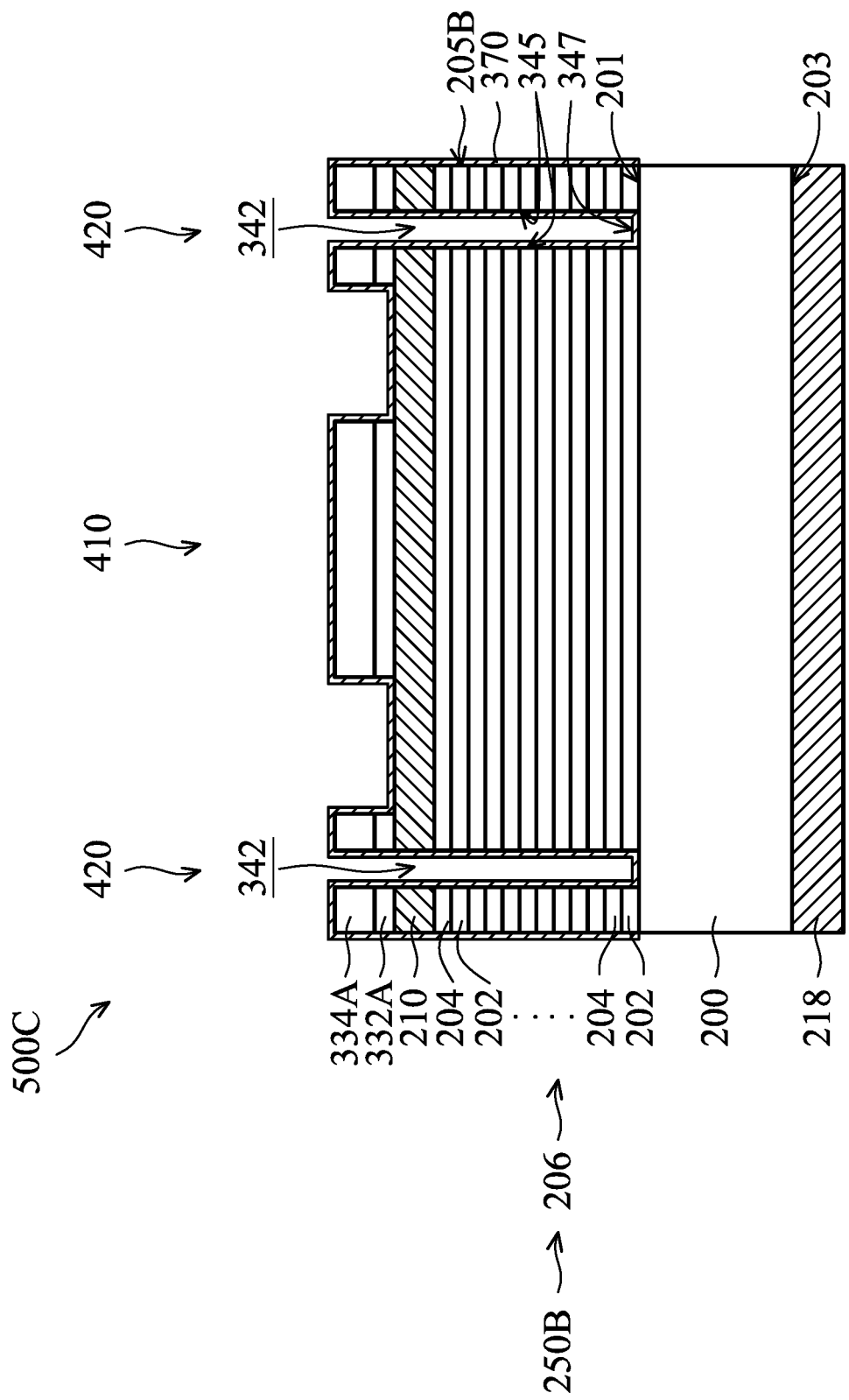

Afterwards, a portion of the capping layer 210 and a portion of the reflective ML 206 are removed to form trenches 342 by a patterning process, as shown in FIG. 5E in accordance with some embodiments. The trenches 342 may be formed passing through the absorption patterns 334A, the adhesion patterns 332A, the capping layer 210 and the reflective ML 206. The trenches 342 may expose the top surface 201 of the mask substrate 200. In addition, the absorption patterns 334A surrounded by the trenches 342 may serve as reticle pattern of the resulting reticle 500C.

In some embodiments, the patterning process may include a photolithography process and a subsequent etching process. The photolithography process is configured to form photoresist patterns (not shown) on the absorption patterns 334A and the capping layer 210. The etching process is configured to remove the portion of the capping layer 210 and the portion of the reflective ML 206 that are not covered by the photoresist patterns. In addition, the photolithography process may include photoresist coating (e.g. spin-on coating), soft baking, mask aligning, exposure, post-exposure baking, developing the photoresist, rinsing and drying (e.g. hard baking). The etching process may include a dry etching process.

Afterwards, a passivation layer 370 is formed over the absorption patterns 332A, the adhesion patterns 334A and along sidewall surfaces 345 and bottom surfaces 347 of the trenches 342, as shown in FIG. 5E in accordance with some embodiments. The passivation layer 370 is conformally formed on the absorption patterns 332A. In addition, the passivation layer 370 is formed on a sidewall surface 305 of a stack including the absorption pattern 334A, the adhesion pattern 334A, the reflective ML 206 and the capping layer 210 positioned outside the trenches 342. The passivation layer 370 is configured to prevent the absorption patterns 334A of the resulting reticle 500C from contamination. In some other embodiments, the passivation layer 370 is optional. The materials, configurations, structures and/or processes of the passivation layer 370 may be similar to, or the same as, those of the passivation layer 270 shown in FIG. 1K, and the details thereof are not repeated herein.

After performing the aforementioned processes, the reticle 500C is formed, as shown in FIG. 5E in accordance with some embodiments.

In some embodiments, the reticle 500C includes a pattern portion 410 and a border portion 420, in a cross-sectional view shown in FIG. 5E. In some embodiments, the pattern portion 410 is located in the center portion of the reticle 500C. Therefore, absorption patterns 334A positioned within the pattern portion 410 may serve as reticle patterns of the reticle 500C. The border portion 420 may surround the pattern portion 410. The passivation layer 370 may be conformally formed on the pattern portion 410 and the border portion 420. In addition, the pattern portion 410 is separated from the border portion 420 by the trench 342. When the trench 342 partially surrounds the pattern portion 410, a portion of the reticle 500C in contact with to the pattern portion 410 and the border portion 420 may serve as a bridge portion (not shown).

In some embodiments, the absorption patterns 334A of the reticle 500C has a high extinction coefficient (k) (e.g. in a range from about 0.04 to about 0.09). Therefore, the thickness of the absorption patterns 334A of the reticle 500C may be reduced further (e.g. to a range from about 20 nm to about 40 nm). The mask shadowing effect during the exposure process may be reduced or eliminated. In addition, the depth of focus (DOF) of the reticle 500C may be reduced. In addition, the process for manufacturing the reticle 500C includes using the adhesion layer 332 formed between the absorption layer 334 and the capping layer 210. During the etching process 360 for forming the absorption patterns 334A, the underlying adhesion layer 332 may be provided for detecting the transition of the signal between the absorption layer 334 and the underlying adhesion layer 332. In addition, the end point of the absorption layer 334 in the etching process 360 may be easy to be detected. Therefore, the etching process 360 used for the formation of the absorption patterns 334A may be well controlled.

FIGS. 6A-6E are cross-sectional views of various stages of a process for manufacturing a reticle 500D, in accordance with some embodiments. The materials, configurations, structures and/or processes of the reticle 500D may be similar to, or the same as, those of the reticle 500C, and the details thereof are not repeated herein. One of the differences between the reticle 500C and the reticle 500D is that the reticle 500D includes a sacrificial multilayer 380 is formed over the absorption layer 334 of the blank reticle 250C. In some embodiments, the sacrificial multilayer 380 includes the anti-reflection layer 216, the hard mask layer 220 and the resist layer 222. The process shown in FIGS. 6A-6E may provide an improved resolution of the photolithography process of the absorption patterns.

Figure 6A:
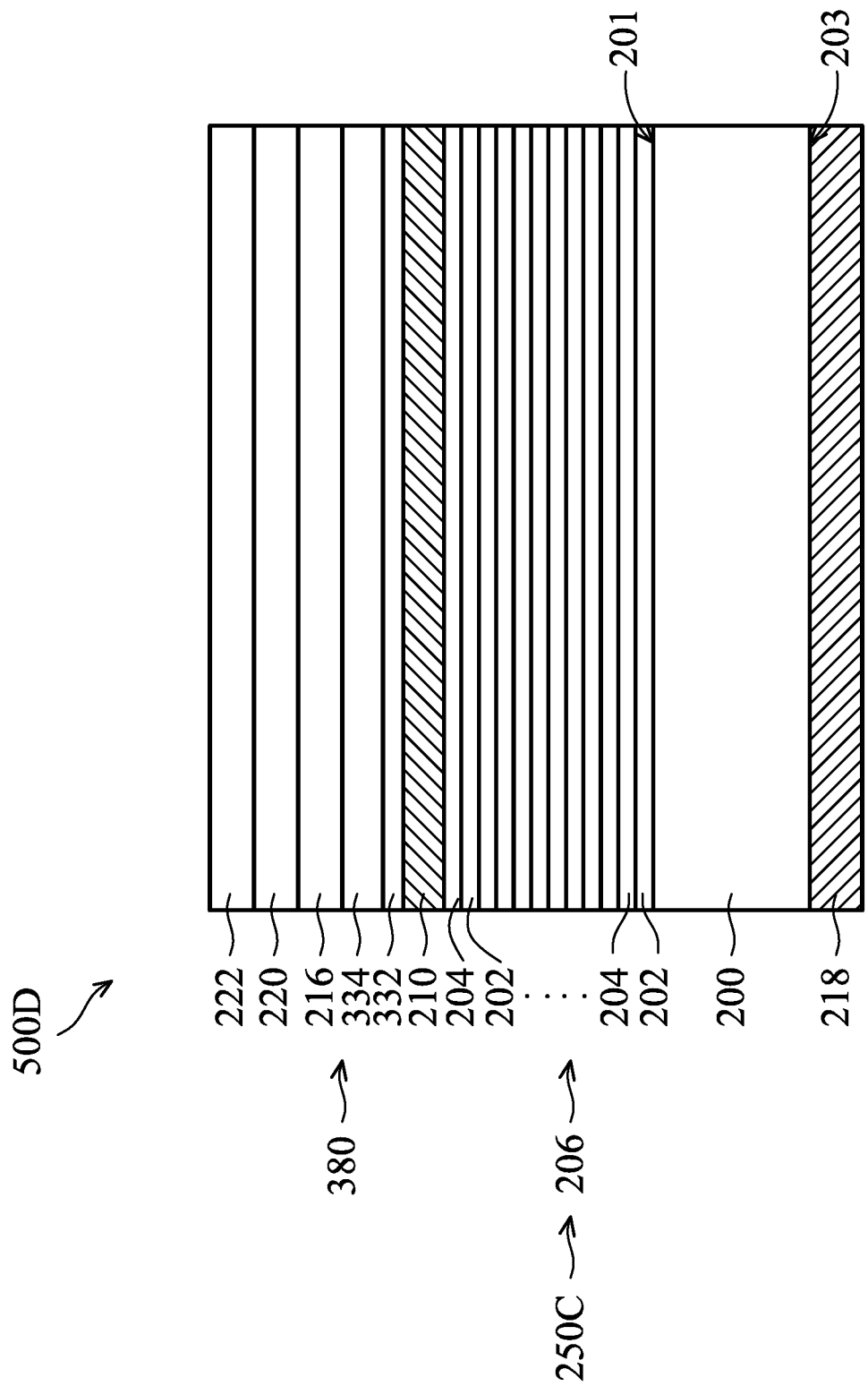
FIGS. 6A-6E are cross-sectional views of various stages of a process for manufacturing a reticle structure, in accordance with some embodiments.
Figure 6B:
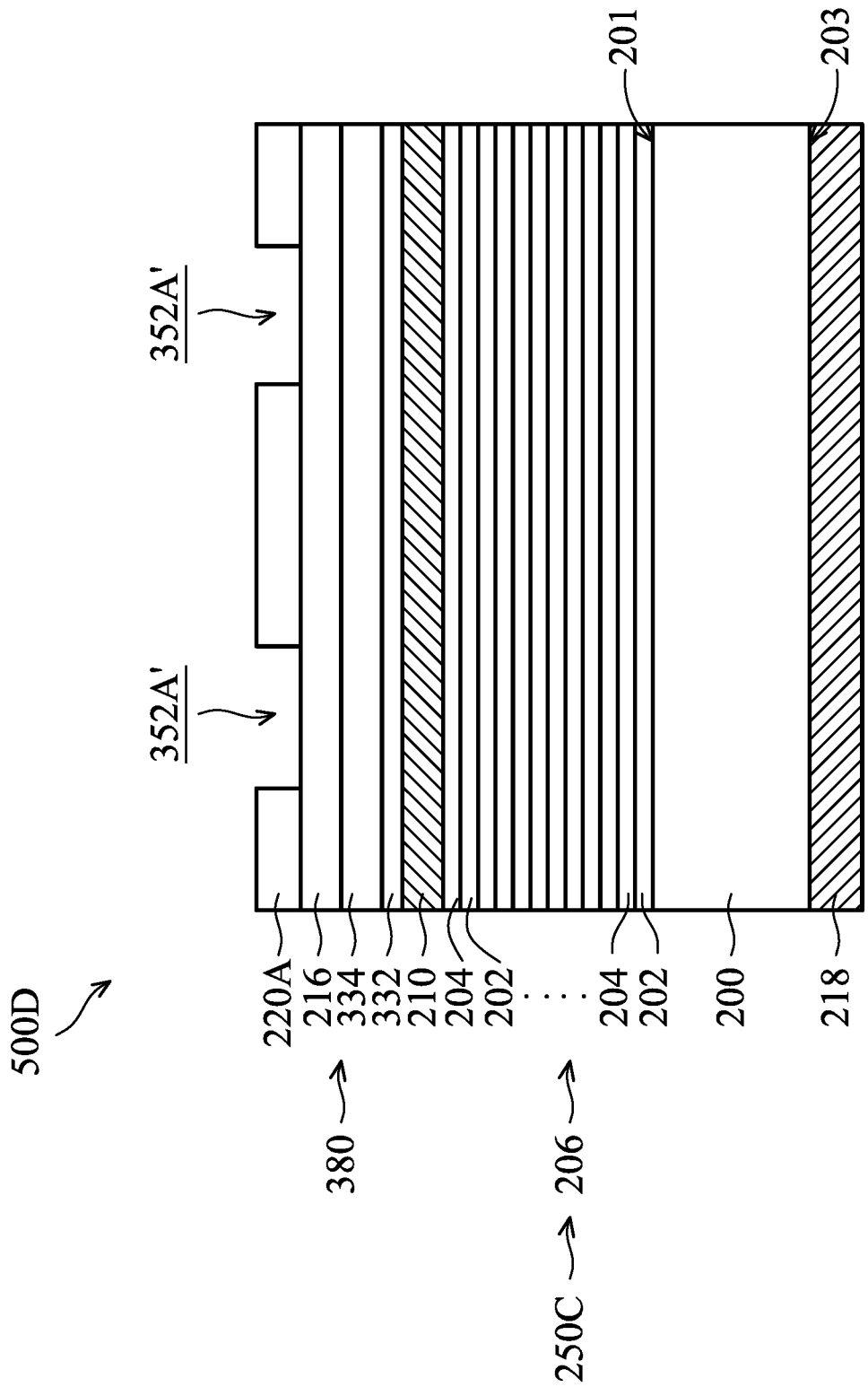

Afterwards, the process shown in FIG. 1C is performed to form photoresist patterns (similar to resist patterns 222A shown in FIG. 1C) and hard mask patterns 220A are formed over the anti-reflection layer 216 by the patterning process shown in FIG. 5B. Openings 352A' are formed passing through the hard mask layer 220 to form the hard mask patterns 220A and expose a portion of the anti-reflection layer 216. After the hard mask patterns 220A are formed, the photoresist patterns are removed from the hard mask patterns 220A by the processes shown in FIG. 2A, as shown in FIG. 6B in accordance with some embodiments.

Figure 6C:
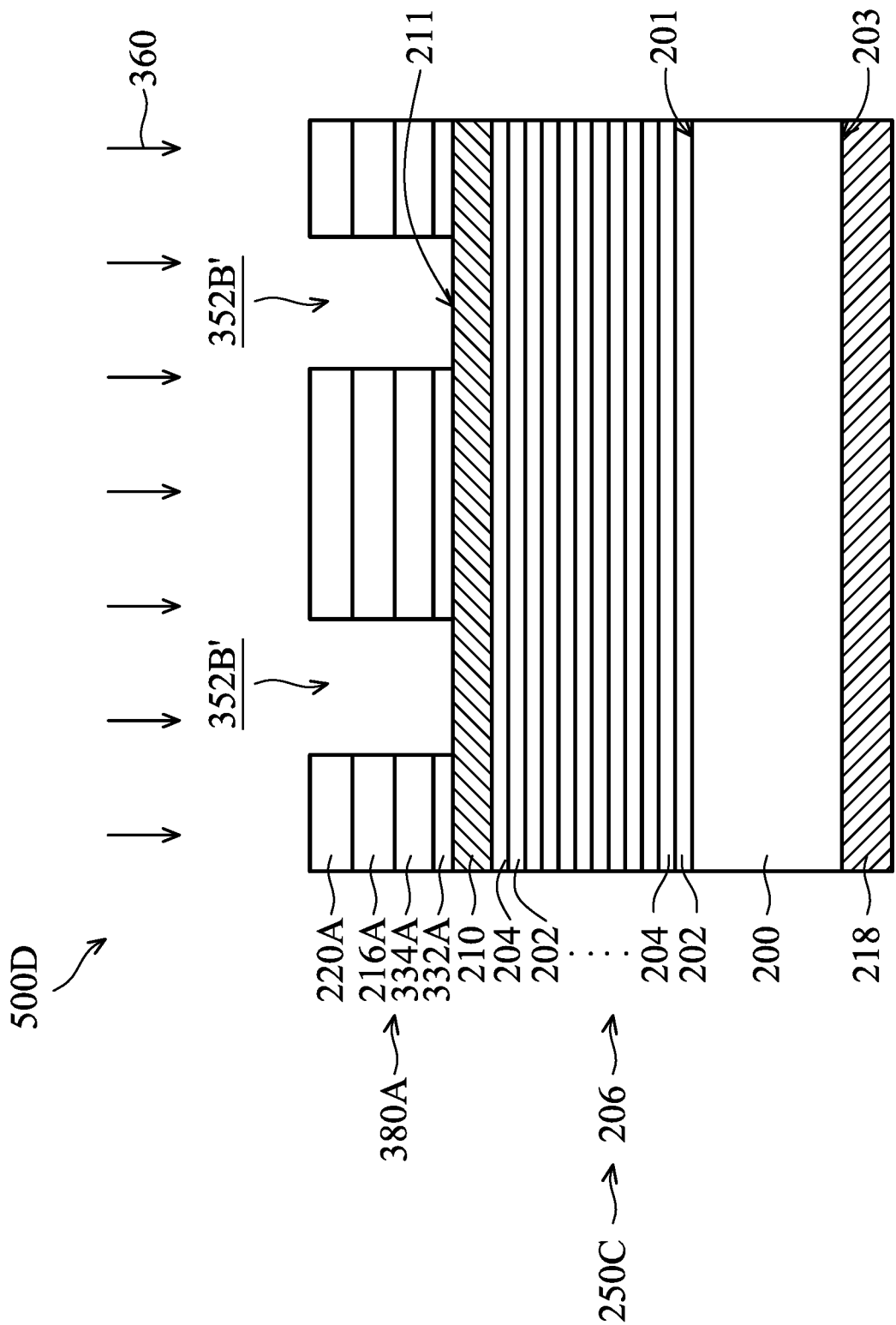

Afterwards, the etching process of the anti-reflection layer 216 shown in FIG. 2A is performed to form anti-reflection patterns 216A, as shown in FIG. 6C in accordance with some embodiments. Openings 352B' are formed passing through the anti-reflection layer 216, to form the hard mask patterns 220A and expose a portion of the anti-reflection layer 216. As shown in FIG. 6C, stacks of the hard mask patterns 220A and the anti-reflection patterns 216A may be used to form sacrificial multilayer patterns 380A covering a portion of a top surface of the absorption layer 334 (FIG. 6B).

Afterwards, the etching process 360 shown in FIG. 5C is performed to form adhesion patterns 332A and absorption patterns 334A, as shown in FIG. 6C in accordance with some embodiments. The etching process 360 may be performed to openings 352B' passing through the absorption layer 334 and the adhesion layer 332 to expose the capping layer 210 (FIG. 6B). Therefore, the anti-reflection layer 216 is patterned to form the anti-reflection patterns 216A. In addition, the absorption layer 334 is patterned to form the absorption patterns 334A. Furthermore, the adhesion layer 332 is patterned to form the adhesion patterns 332A after performing the etching process 360.

Figure 6D:
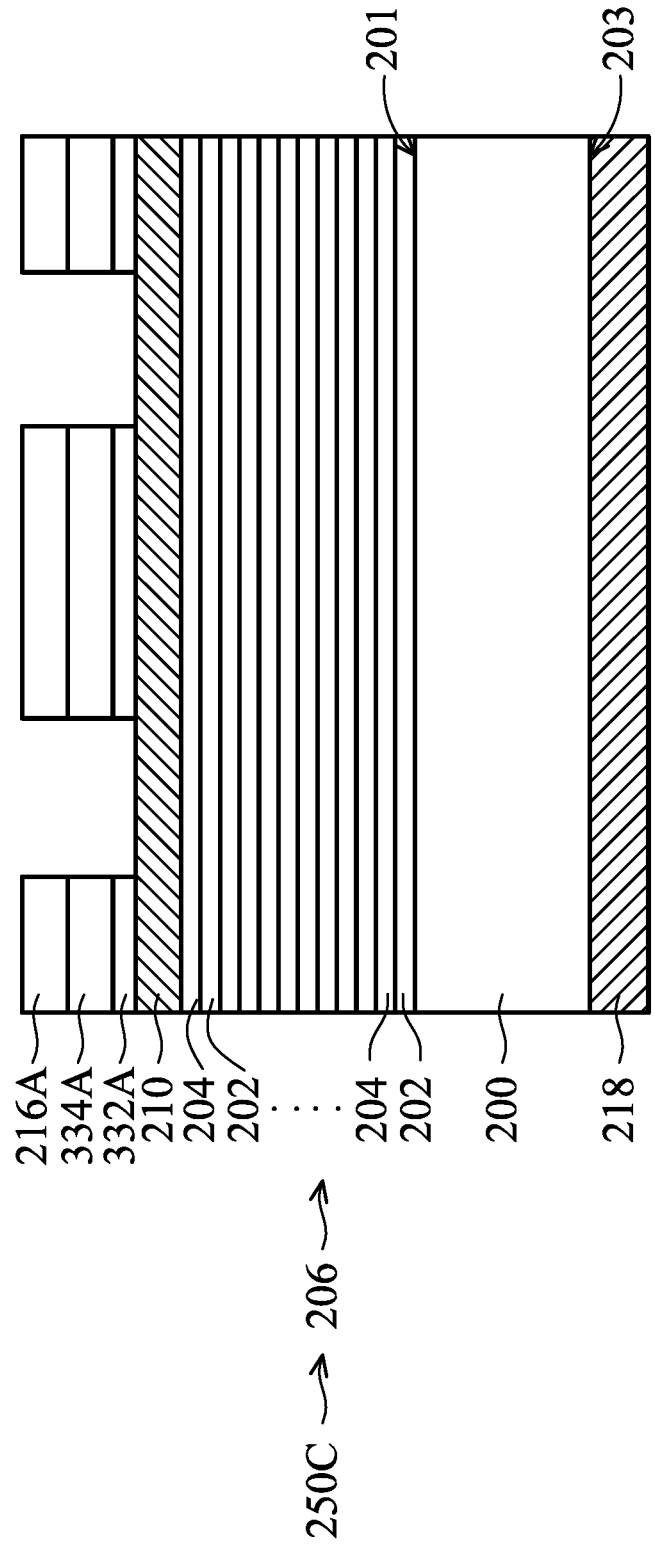
Figure 6E:
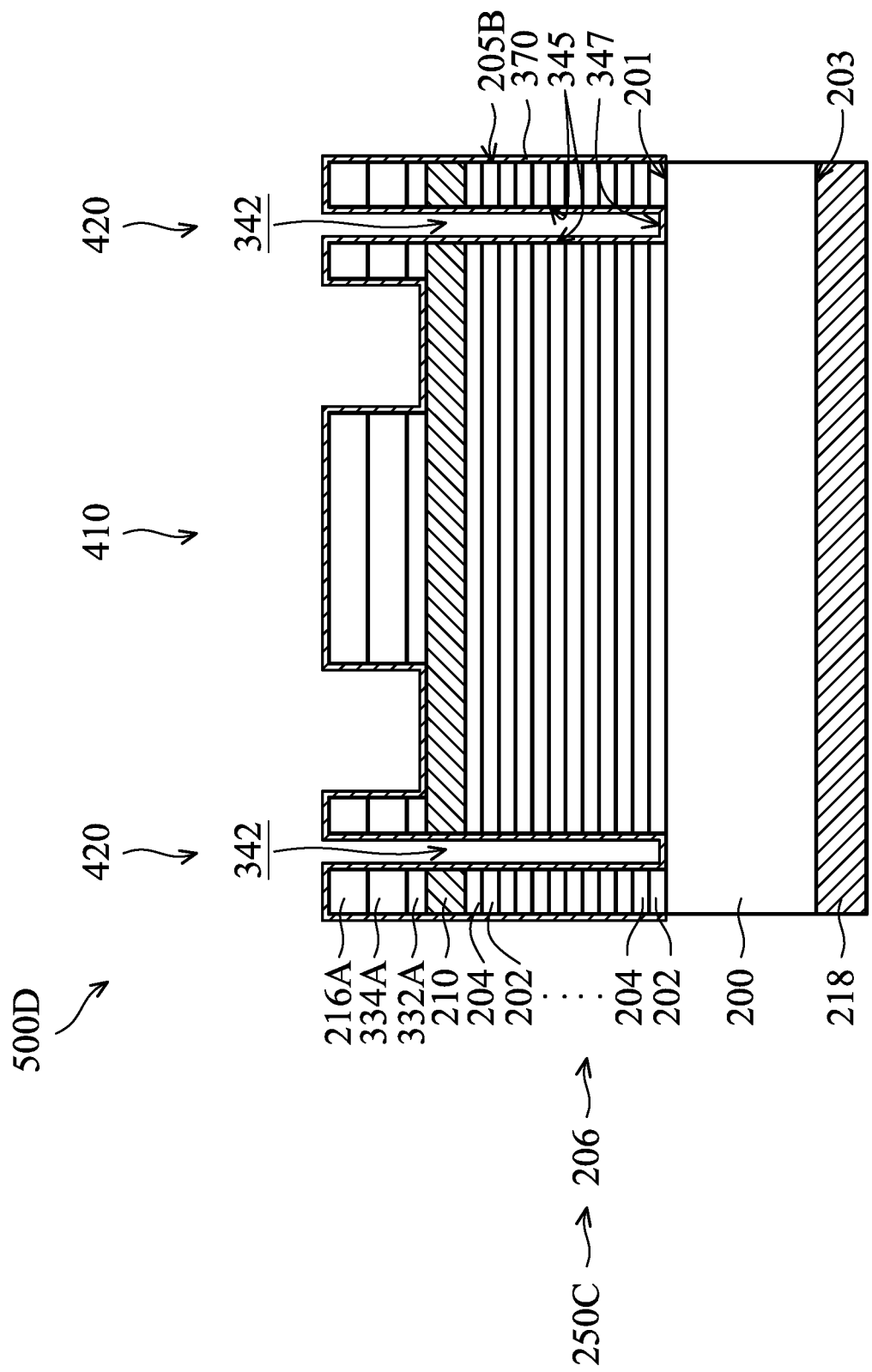

Afterwards, the hard mask patterns 220A are removed to expose the anti-reflection patterns 216A by a removal process, as shown in FIG. 6D in accordance with some embodiments. The anti-reflection patterns 216A, the absorption layer 334 and the adhesion layer 332 are positioned on the capping layer 210. The absorption layer 334 may serve as absorption patterns of the reticle 500D after performing the removal process. In some embodiments, the removal process includes a dry etching process. In some embodiments, the etching processes are performed using an etching gas including chlorine ($Cl_2$), fluorine ($F_2$), carbon (C), oxygen ($O_2$), nitrogen ($N_2$), $SF_6$, $CH_3Cl$, $CH_2Cl_2$ or their mixture thereof.

Afterwards, processes similar to the processes shown in FIG. 5E are performed to form the passivation layer 370 on the pattern portion 410 and the border portion 420. The passivation layer 370 may cover the anti-reflection patterns 216A, the absorption layer 334 and the adhesion layer 332. In addition, the pattern portion 410 is separated from the border portion 420 by the trench 342. After performing the aforementioned processes, the reticle 500D is formed, as shown in FIG. 5E in accordance with some embodiments. In some embodiments, the removal process of the photoresist patterns can prevent the sacrificial multilayer patterns from the undesired pattern collapse problem. Therefore, the resolution of the photolithography process of the absorption patterns may be improved.

As described previously, the method for manufacturing the reticle 500A includes forming a sacrificial multilayer 230 with the openings 232C to expose the capping layer 210. Afterwards, an absorption layer 234 is formed over the sacrificial multilayer 230 and covering the capping layer 210 in the opening 232C. The method further includes removing the absorption layer 234 outside the opening 232C in the sacrificial multilayer 230 to form an absorption pattern 234B on a portion of the capping layer 210. Therefore, the resulting absorption patterns 234B may be formed without patterning the absorption layer 234 using a mask and a subsequent etching process. In addition, the material of the absorption patterns 234B may have a higher extinction coefficient (k) (e.g. in a range from about 0.04 to about 0.09) than the extinction coefficient (k) of Ta-based materials. The thickness of the absorption patterns 234B of the reticle 500A may be reduced further (e.g. to a range from about 20 nm to about 40 nm). Therefore, the mask shadowing effect during the exposure process may be reduced or eliminated, and the depth of focus (DOF) of the reticle 500B may be reduced.

As described previously, the process for manufacturing the reticle 500B includes depositing an adhesion layer 332 between the absorption layer 212 and the capping layer 210. The adhesion layer 232 may be configured to improve adhesion between the capping layer and subsequent absorption patterns (e.g. the second portions 234B of the absorption layer 234). In addition, the adhesion layer may help to detect the end point in the etching process of the absorption layer 212.

As described previously, the process for manufacturing the reticles 500C and 500D includes depositing an adhesion layer between the absorption layer 334 and the capping layer 210. The method further includes removing portions of the absorption layer and the adhesion layer using the hard mask pattern 220A as a mask to form an adhesion pattern 332A and an absorption pattern 334A overlying the adhesion pattern 332A. In some embodiments, the adhesion layer 332 may help to detect the end point of the absorption layer 334 in the etching process 360 for the formation of the absorption pattern 334A. When the absorption layer 334 uses an absorption material having a high extinction coefficient (k) (e.g. in a range from about 0.04 to about 0.09), the etching process of the absorption layer may be well controlled. The thickness of the absorption patterns 334A of the reticles 500C and 500D may be further reduced. Therefore, the mask shadowing effect during the exposure process may be reduced or eliminated, the depth of focus (DOF) of the reticles 500C and 500D may be reduced.

Embodiments of a reticle and a method for manufacturing the same are provided. The method includes a forming an absorption layer is over the sacrificial multilayer and covering the capping layer in the opening in the sacrificial multilayer. The method further includes removing the absorption layer outside the opening in the sacrificial multilayer to form an absorption pattern on a portion of the capping layer. Therefore, the resulting absorption patterns may be formed without patterning the absorption layer using a mask and a subsequent etching process. In addition, the material of the absorption patterns may have an extinction coefficient (k) in a range from about 0.04 to about 0.09. The thickness of the absorption patterns of the reticle may be reduced. The mask shadowing effect during the exposure process may be reduced or eliminated.

In some embodiments, a method for manufacturing a reticle is provided. The method includes forming a reflective multilayer (ML) over a front-side surface of a mask substrate. The method further includes forming a capping layer over the reflective ML. The method further includes forming a sacrificial multilayer over the capping layer. The method further includes forming an opening in the sacrificial multilayer to expose the capping layer. The method further includes forming a first absorption layer over the sacrificial multilayer and covering the capping layer in the opening. The method further includes removing the first absorption layer outside the opening in the sacrificial multilayer to form a first absorption pattern on a portion of the capping layer.

In some embodiments, a method for manufacturing a reticle is provided. The method includes forming a reflective multilayer (ML) over a front-side surface of a mask substrate. The method further includes forming a capping layer over the reflective ML. The method further includes depositing an adhesion layer over the capping layer. The method further includes depositing an absorption layer over the adhesion layer. The method further includes forming a hard mask pattern over absorption layer. The method further includes removing portions of the absorption layer and the adhesion layer using the hard mask pattern as a mask to form an adhesion pattern and an absorption pattern overlying the adhesion pattern.

In some embodiments, a reticle is provided. The reticle includes a mask substrate, a reflective multilayer (ML), a capping layer, an adhesion pattern and an absorption pattern. The mask substrate has a front-side surface and a back-side surface. The reflective ML is positioned over the front-side surface of mask substrate. The capping layer is positioned over the reflective ML. The adhesion pattern is positioned over the capping layer. The absorption pattern is positioned over the adhesion pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a reticle, comprising:
   forming a reflective multilayer (ML) over a front-side surface of a mask substrate;
   forming a capping layer over the reflective ML;
   forming a sacrificial multilayer over the capping layer;
   forming an opening in the sacrificial multilayer to expose the capping layer;
   forming a first absorption layer over the sacrificial multilayer and covering the capping layer in the opening, wherein the first absorption layer is in contact with a first portion of a sidewall surface of the sacrificial multilayer in the opening and exposes a second portion of the sidewall surface of the sacrificial multilayer, wherein forming the sacrificial multilayer comprises:
   forming an anti-reflection layer over the capping layer; and
   forming a hard mask layer over the anti-reflection layer, wherein a sidewall of the anti-reflection layer is aligned with a sidewall of the hard mask layer in the opening, and the sidewall of the anti-reflection layer and the sidewall of the hard mask layer are continuous when the first absorption layer is formed in the opening; and
   removing the first absorption layer outside the opening in the sacrificial multilayer to form a first absorption pattern on a portion of the capping layer.

2. The method for manufacturing a reticle as claimed in claim 1, wherein forming the first absorption layer comprises:
   forming a first portion of the first absorption layer in contact with a top surface of the sacrificial multilayer; and
   forming a second portion of the first absorption layer in contact with a top surface of the capping layer and the sidewall surface of the sacrificial multilayer,
   wherein the first portion and the second portion of the first absorption layer are formed simultaneously.

3. The method for manufacturing a reticle as claimed in claim 1, wherein removing the first absorption layer outside the opening in the sacrificial multilayer comprises removing a portion of the first absorption layer on a top surface of the sacrificial multilayer.

4. The method for manufacturing a reticle as claimed in claim 1, further comprising:
   removing the sacrificial multilayer to expose the capping layer after removing the first absorption layer outside the opening of the sacrificial multilayer.

5. The method for manufacturing a reticle as claimed in claim 1, wherein forming the sacrificial multilayer further comprises:
   forming a first photoresist layer over the hard mask layer.

6. The method for manufacturing a reticle as claimed in claim 5, wherein forming the first opening in the sacrificial multilayer comprises:
   patterning the first photoresist layer to form a first photoresist pattern on the hard mask layer;
   removing a portion of the hard mask layer that is not covered by the first photoresist pattern to form a hard mask pattern on the anti-reflection layer; and
   removing a portion of the anti-reflection layer that is not covered by the first photoresist pattern and the hard mask pattern to form an anti-reflection pattern on the capping layer.

7. The method for manufacturing a reticle as claimed in claim 5, wherein forming the sacrificial multilayer comprises:
   forming a second absorption layer over the capping layer before forming the anti-reflection layer, wherein the extinction coefficient (k) of the first absorption layer is greater than the extinction coefficient (k) of the second absorption layer.

8. The method for manufacturing a reticle as claimed in claim 7, wherein forming the first opening in the sacrificial multilayer comprises:
   removing a portion of the second absorption layer that is not covered by the first photoresist pattern, the hard mask pattern and the anti-reflection pattern.

9. The method for manufacturing a reticle as claimed in claim 1, further comprising:
   removing a portion of the capping layer and a portion of the reflective ML to form a trench surrounding the absorption pattern and exposing the mask substrate; and
   forming a passivation layer over the absorption pattern and along a sidewall surface and a bottom surface of the trench after forming the first absorption pattern.

10. The method for manufacturing a reticle as claimed in claim 9, wherein forming the passivation layer comprises a plasma treatment process, a sol-gel process, a photochemical reaction process or an atomic layer deposition (ALD) process.

11. The method for manufacturing a reticle as claimed in claim 1, further comprising:
    forming a conductive layer over a back-side surface of the mask substrate opposite to the front-side surface of the mask substrate.

12. A method for manufacturing a reticle, comprising:
    forming a reflective multilayer (ML) over a front-side surface of a mask substrate;
    forming a capping layer over the reflective ML;
    depositing a first absorption layer over the capping layer;
    forming an anti-reflection layer over the absorption layer;
    removing portions of the first absorption layer and the anti-reflection layer to form an opening;
    forming a second absorption layer over the anti-reflection layer and in the opening, wherein a first portion of the second absorption layer is over the anti-reflection layer, a second portion of the second absorption layer is in the opening, the first portion and the second portion are discontinuous, and a sidewall of the first portion aligns with a sidewall of the second portion, the second portion of the absorption layer is in contact with a sidewall of the first absorption layer, and an entire bottom surface of the anti-reflection layer is in contact with a top surface of the first absorption layer; and
    removing the anti-reflection layer after forming the second absorption layer.

13. The method for manufacturing a reticle as claimed in claim 12, further comprising:
    removing portions of the capping layer and the reflective multilayer to form a trench in the first absorption layer and exposing the mask substrate; and forming a passivation layer along the sidewall surface and a bottom surface of the trench, and over the first absorption layer.

14. The method for manufacturing a reticle as claimed in claim 13, wherein forming the passivation layer comprises exposing the sidewall surface and the bottom surface of the trench to a nitrogen-based gas selected from the group of $N_2$, $NH_3$, $N_2H_3$ and $NO_2$.

15. The method for manufacturing a reticle as claimed in claim 12, further comprising:
    forming a conductive layer over a back-side surface of the mask substrate opposite to the front-side surface of the mask substrate.

16. A method for manufacturing a reticle, comprising:
    forming a reflective multilayer (ML) over a mask substrate;
    forming a capping layer over the reflective ML;
    forming a first absorption layer over the capping layer;
    forming an anti-reflection layer over the first absorption layer;
    forming a hard mask layer over the anti-reflection layer;
    forming an opening in the first absorption layer, the anti-reflection layer, and the hard mask layer, wherein the first absorption layer, the anti-reflection layer and the hard mask layer has a continuous sidewall in the opening;
    forming a second absorption layer in the opening and over the hard mask layer, wherein the second absorption layer is in contact with a first portion of the continuous sidewall and exposes a second portion of the continuous sidewall; and
    removing a portion of the absorption layer over the hard mask layer; and
    removing the anti-reflection layer after forming the second absorption layer.

17. The method for manufacturing a reticle as claimed in claim 16, wherein a first maximum width of the opening in the first absorption layer is identical to a second maximum width of the opening in the anti-reflection layer before removing the anti-reflection layer.

18. The method for manufacturing a reticle as claimed in claim 16, wherein a bottom surface of the anti-reflection layer is not exposed from the first absorption layer before removing the anti-reflection layer.

19. The method for manufacturing a reticle as claimed in claim 16, wherein a sidewall of the anti-reflection layer is aligned with a sidewall of the hard mask layer in the opening before removing the anti-reflection layer.

20. The method for manufacturing a reticle as claimed in claim 16, further comprising removing the first absorption layer after removing the anti-reflection layer.

* * * * *